United States Patent [19]

Ichinoi et al.

[11] Patent Number: 5,767,705

[45] Date of Patent: Jun. 16, 1998

[54] FREQUENCY CONVERTING CIRCUIT

[75] Inventors: Yutaka Ichinoi, Yokohama; Yukinobu Ishigaki, Miura, both of Japan

[73] Assignee: Victor Company of Japan, Ltd., Yokohama, Japan

[21] Appl. No.: 682,996

[22] Filed: Jul. 18, 1996

[30] Foreign Application Priority Data

Jul. 18, 1995 [JP] Japan ................................ 7-203992
Jul. 19, 1995 [JP] Japan ................................ 7-205377

[51] Int. Cl.$^6$ ................................ G11B 5/04; H04N 9/497
[52] U.S. Cl. ................................ 327/113; 327/231; 327/248; 327/114
[58] Field of Search ................................ 327/113, 114, 327/115, 116, 119, 129, 355, 356, 403, 407, 231, 248

[56] References Cited

U.S. PATENT DOCUMENTS 3,912,916 10/1975 Grun et al. ................................ 327/552
4,868,428 9/1989 Cooper ................................ 327/113

FOREIGN PATENT DOCUMENTS 357152789 9/1982 Japan ................................ 327/113

OTHER PUBLICATIONS

"Digital Analog Communication System (First Volume)" by B. P. Russi, pp. 226–251, published by CBS Corp., Mar. 28, 1995.

Primary Examiner—Timothy P. Callahan
Assistant Examiner—Dinh Le
Attorney, Agent, or Firm—Jacobson, Price, Holman & Stern, PLLC

[57] ABSTRACT

A frequency converting circuit has a phase divider, a switching circuit, and switching pulse generator. The phase divider divides a phase of a first input signal and outputting m-units of channel signals having a same frequency but different phases shifted $2\pi/m$ by $2\pi/m$ radian respectively, where m is a three or more natural number except $2^n$ (n: a natural number). The m-units of the channel signals are switched by the switching circuit to output switched channel signals. In response to a second input signal having a frequency higher than that of the first input signal, the switching pulse generator generates switching pulse signals, and switches and outputs the m-units of channel signals having different phases shifted $2\pi/m$ by $2\pi/m$ radian for each constant period, by controlling the switching circuit based on the switching pulse signals. The switched channel signals are synthesized to output a signal having a frequency difference between the first input signal and the switching pulse signals or a frequency addition of the first input signal and the switching pulse signals.

13 Claims, 25 Drawing Sheets

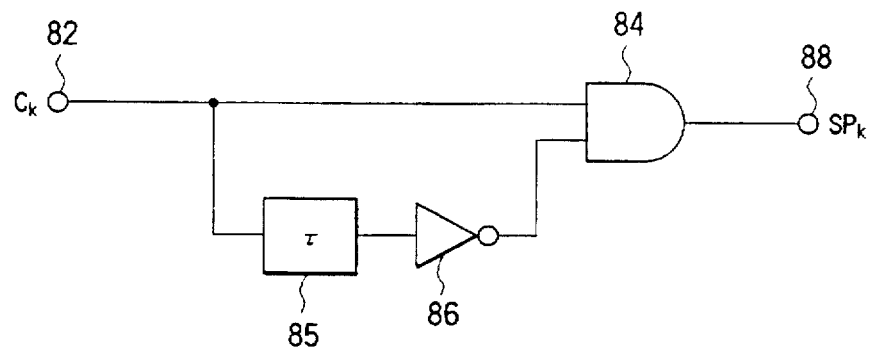
FIG. 17
FIG. 18A
FIG. 18B
FIG. 18C
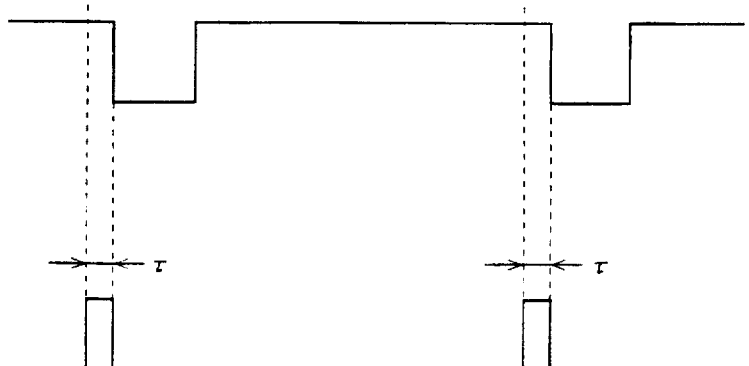
→ TIME

5,767,705

1

FREQUENCY CONVERTING CIRCUIT

BACKGROUND OF THE INVENTION

The present invention relates to a frequency converting circuit. More specifically, the present invention relates to a frequency converting circuit to which applied is a system for forming a phase shift type single side band signal.

There are conventional frequency converting circuits for obtaining a single side band signal (referred to as SSB signal, hereinafter). In a first frequency converting circuit, a carrier is first suppressed by multipliers and balanced modulators or double balanced mixers (referred to as DBMs, hereinafter) to obtain both side band signals; each side band signal is selectively separated by a filter to generate a SSB signal. In a second frequency converting circuit, a carrier and a signal to be converted are both shifted by 90 degrees and then supplied to two DBMs; two output signals of the two DBMs are added to or subtracted from each other to omit the filter in principle. These conventional circuits are disclosed in "Digital Analog Communication System (First Volume)" by B. P. Russi, P226 to P251, published by CBS corp. Mar. 28, 1985.

In frequency conversion executed on the basis of two high signal frequencies f1 and f2 by the first conventional circuit, it is possible to easily obtain the addition of the frequencies (f1+f2) or the subtraction of the frequencies (f1–f2) by the conventional circuits with the multiplier and filter. However, in the case where any one of the two frequencies is high and the other is extremely low, it is almost impossible to separate the frequencies from each other by the filter.

The phase shift type SSB signal forming circuit is used for overcoming this problem. In this circuit, since no filter is needed in principle, it is possible to select the addition (f1+f2) or the subtraction (f1–f2) as far as the operation of the two signals are well balanced in the DBM. Therefore, the frequency adjacent to the frequency f1 or f2 can be well suppressed, with the result that the above-mentioned problem can be solved. However, a simple filter is used when one of the signals is a switching signal or when switching operation occurs by the DBM.

FIG. 1 shows the conventional frequency converting circuit. In FIG. 1, a first input signal $A_1 \cos Pt$ is supplied via input terminal 111 to a multiplier 112 and a $\pi/2$ phase shifter 113. The phase shifter shifts the phase of the first input signal by $\pi/2$ radian. FIG. 2A shows the first input signal, and FIG. 2B shows the $\pi/2$-shifted first signal. The shifted first signal is supplied to another multiplier 114.

A second input signal shown in FIG. 2C is supplied via input terminal 115 to the multiplier 114 through another $\pi/2$ phase shifter 116. The second input signal is of square waveform including high harmonic components. When the fundamental frequency is focussed on without consideration of the high harmonic components, the second input signal can be expressed as $A_2 \cos Ct$. The output signal of the $\pi/2$ phase shifter 116 is obtained as a signal by shifting the second input signal $A_2 \cos Ct$ by $\pi/2$ radian. Thus, the fundamental frequency of the second input signal can be expressed as $A_2 \sin Ct$.

The multiplier 112 multiplies the first input signal with the second input signal, and output a signal E having the fundamental frequency as shown in FIG. 2E and as expressed by the following formula (1). On the other hand, the multiplier 114 multiplies the first input signal shifted by the $\pi/2$ phase shifter 113 with the second input signal shifted by the $\pi/2$ phase shifter 116, and outputs a signal F having

2 the fundamental frequency as shown in FIG. 2F and as expressed by the following formula (2).

$$E = A_1 \cos Pt \cdot A_2 \cos Ct \tag{1}$$
$$= (A_1A_2/2)\{\cos(P-C)t + \cos(P+C)t\}$$

$$F = A_1 \sin Pt \cdot A_2 \sin Ct \tag{2}$$
$$= (A_1A_2/2)\{\cos(P-C)t - \cos(P+C)t\}$$

Therefore, when the two outputs of the multipliers 112 and 114 are added to each other by an arithmetic circuit 117, a difference $(A_1A_2/2)\{\cos(P-C)t\}$ in frequency between the first and second input signals can be obtained. On the other hand, when the two outputs are subtracted from each other by the circuit 117, an addition $(A_1A_2/2)\{\cos(P+C)t\}$ in frequency between the first and second signals can be obtained. Here, when the arithmetic circuit 117 is assumed to operate as an adder, the signal having the difference frequency components between the two input signals as shown in FIG. 2G can be outputted via output terminal 118.

As shown in FIG. 2G, the output signal of the arithmetic circuit 117 includes higher harmonic components. When the output signal passes through a low-pass filter (LPF) 119, only the desired fundamental frequency components as shown in FIG. 2H can be obtained through the LPF 119 and then outputted via output terminal 120. As shown in FIGS. 2A, 2C, and 2H, the first input signal frequency is 1 Hz, the second signal frequency is 4 Hz, and the fundamental component of the output signal is 3 (=4–1) Hz. This explains that the frequency is converted from 1 to 3 Hz.

In the circuit shown in FIG. 1, however, the operation of the balanced modulators or the DBMs used as the multipliers 112 and 114 becomes easily out of balance in the actual circuit. Therefore, once the operation of the circuit is unbalanced, the waveforms shown in FIGS. 2E and 2F are no longer obtained. In addition, when the mixing balance is slightly lost, the arithmetic circuit 117 cannot obtain a correct waveform as shown in FIG. 2G.

Further, in the conventional circuit, when the balancing of the DBM is once lost, an error occurs easily in the signal levels mixed by the arithmetic circuit 117. Thus, when (f1+f2) is selected as the output for instance, f1 corresponding to the adjacent suppressed carrier or the higher harmonic components of the fundamental component of (f1–f2) are mixed as the undesired frequencies. As a result, there arises a problem in that it is impossible to remove the undesired frequencies even by a filter.

In particular, when the frequency converting circuit is integrated on an integrated circuit chip, the balancing of each circuit must be adjusted from the outside of the IC. There arises another problem in that the number of IC pins increases so that the frequency converting circuit using the phase shift type SSB signal forming circuit is not suitable for the IC.

Therefore, there is a need of a frequency converting circuit based upon the phase shift type SSB signal forming system, which is suitable for the IC and can be used from low to high frequency bands without need of any balancing adjustment.

To satisfy the above-mentioned requirement, the applicant has already proposed a frequency converting circuit disclosed by Japanese Laid-Open Patent No. 7(1995)34401, entitled "Frequency Converting Circuit". In this circuit, a first input signal is phase-shifted by a phase divider to output a plurality of channel signals; and the shifted channel signals are switched in response to switching signals generated on the basis of a second input signal.

3

In detail, in this proposed circuit, the phase of the first input signal is shifted to obtain four channel signals shifted π/2 radian from each other; and the shifted channel signals are switched separately by four switching circuits in response to four switch signals generated on the basis of the second input signal. It is thus possible to obtain four signals each of which phases is advanced or delayed in sequence for each ¼ of one period of the second input signal. In other words, this proposed circuit can obtain the output signal equivalent to the conventional circuit shown in FIG. 1, without use of any balanced modulator or adder.

In addition, the Japanese Laid-Open Patent discloses that the first input signal is divided into eight channel signals; and the divided eight channel signals are outputted in sequence for each ⅛ of one period of the second input signal. The obtained signals are approximately the sine wave of the desired frequency difference (f2−f1) or addition (f2+f1). In this case, a LPF having gently sloped frequency characteristics is used as connected to the output terminal. There exists such an advantage that the scale of the used LPF can be minimized.

In the Japanese Laid-Open Patent, however, only the case where the number of the divided phases is $2^n$ (n is a natural number of 2 or more) is disclosed. Therefore, when the fine phase division of more than 4 (=$2^2$) equivalent to the conventional circuit shown in FIG. 1 is required, since the succeeding phase division is eight (=$2^3$), there exists a problem in that the number of switches increases and thereby the circuit is rather complicated. In addition, it is difficult to form a frequency converting circuit whose construction is simpler than that of the four-phase division frequency converting circuit.

SUMMARY OF THE INVENTION

It is an object of the present invention to provide a frequency converting circuit that can output m-units of channel signals having a same frequency but different phases shifted 2π/m by 2π/m radian respectively, where m is a three or more natural number except $2^n$ (n: a natural number).

The present invention provides a frequency converting circuit, comprising: phase dividing means for dividing a phase of a first input signal and outputting m-units of channel signals having a same frequency but different phases shifted 2π/m by 2π/m radian respectively, where m is a three or more natural number except $2^n$ (n: a natural number); switching means for switching the m-units of the channel signals and outputting switched channel signals; and switching pulse generating means responsive to a second input signal having a frequency higher than that of the first input signal, for generating a plurality of switching pulse signals and further for switching and outputting the m-units of channel signals having different phases shifted 2π/m by 2π/m radian for each constant period, by controlling the switching means on the basis of the generated switching pulse signals, wherein the switched channel signals are synthesized to output a signal having a frequency difference between the first input signal and the switching pulse signals or a frequency addition of the first input signal and the switching pulse signals.

The phase dividing means may comprise: phase shifting means for outputting the first input signal as it is as a first channel signal of the m-units of the channel signals, and a third signal having a phase different from the first input signal by 90 degrees; an inverter for inverting a phase of the first channel signal to output a first phase inversion signal;

4 first level adjusting means for adjusting a level of the third signal at a first predetermined level; and output means for outputting (m−1)-units of channel signals other than the first channel signal, on the basis of the first phase inversion signal and the third signal adjusted at the first predetermined level.

The switching pulse generating means may comprise: a counter responsive to the second input signal, for counting the natural number m, and for outputting a carry signal having a frequency m-times higher than that of the channel signals; and a flip-flop circuit having m-stage series connected flip-flops, for generating the switching pulse signals each having a frequency m-times higher than that of the channel signals and shifted for each constant period, on the basis of the second input signal inputted to clock inputs of the respective flip-flops and the carry signal inputted to the first-stage flip-flop.

The switching pulse generating means may comprise: a frequency generator responsive to the second input signal, for outputting a first pulse signal having a frequency m-times higher than that of the second input signal; a counter for counting the pulse signal and for outputting a carry signal having a frequency m-times higher than that of the channel signals; a flip-flop circuit having a m-stage series connected flip-flops, for generating m-units of second pulse signals each having a frequency m-times higher than that of the channel signals and shifted for each constant period, on the basis of the pulse signal inputted to clock inputs of the respective flip-flops and the carry signal inputted to the first-stage flip-flop; and a pulse generator responsive the m-units of the second pulse signals, for generating a plurality of the switching pulse signals each having a pulse width narrower than that of the second pulse signal.

The switching pulse generator may comprise, when m is three: first delay means for delaying the second input signal by −π/3 radian to output a first delay signal; a first EX-OR circuit for EX-ORing the second input signal and the first delay signal to output a first switching pulse signal; second delay means for delaying the first delay signal by −π/3 radian to output a second delay signal; a second EX-OR circuit for EX-ORing the first and second delay signals to output a second switching pulse signal delayed by a predetermined period with respect to the first switching pulse signal; an inverter for inverting the second input signal; and a third EX-OR circuit for EX-ORing the second delay signal and the inverted second signal to output a third switching pulse signal delayed by the predetermined period with respect to the second switching pulse signal.

The frequency conversion circuit may further comprise: first gating means for passing an output signal of the switching means on the basis of the second input signal; an inverter for inverting the output signal of the switching means and outputting the inversion signal; and second gating means for passing the inversion signal on the basis of an inversion signal of the second input signal, wherein output signals of the first and second gating means are synthesized to output a signal having a frequency difference between the first input signal and the plurality of the switching pulse signals or a frequency addition of the first input signal and the plurality of the switching pulse signals.

BRIEF DESCRIPTION OF THE DRAWINGS

FIG. 17 is a block diagram showing another essential portion of the sampling pulse generator shown in FIG. 14;

FIGS. 18A, 18B and 18C are signal waveforms for assistance in explaining the operation of the circuit shown in FIG. 17;

DETAILED DESCRIPTION OF THE PREFERRED EMBODIMENTS

Preferred embodiments of the frequency converting circuit according to the present invention will be described hereinbelow with reference to the attached drawings.

Figure 1:
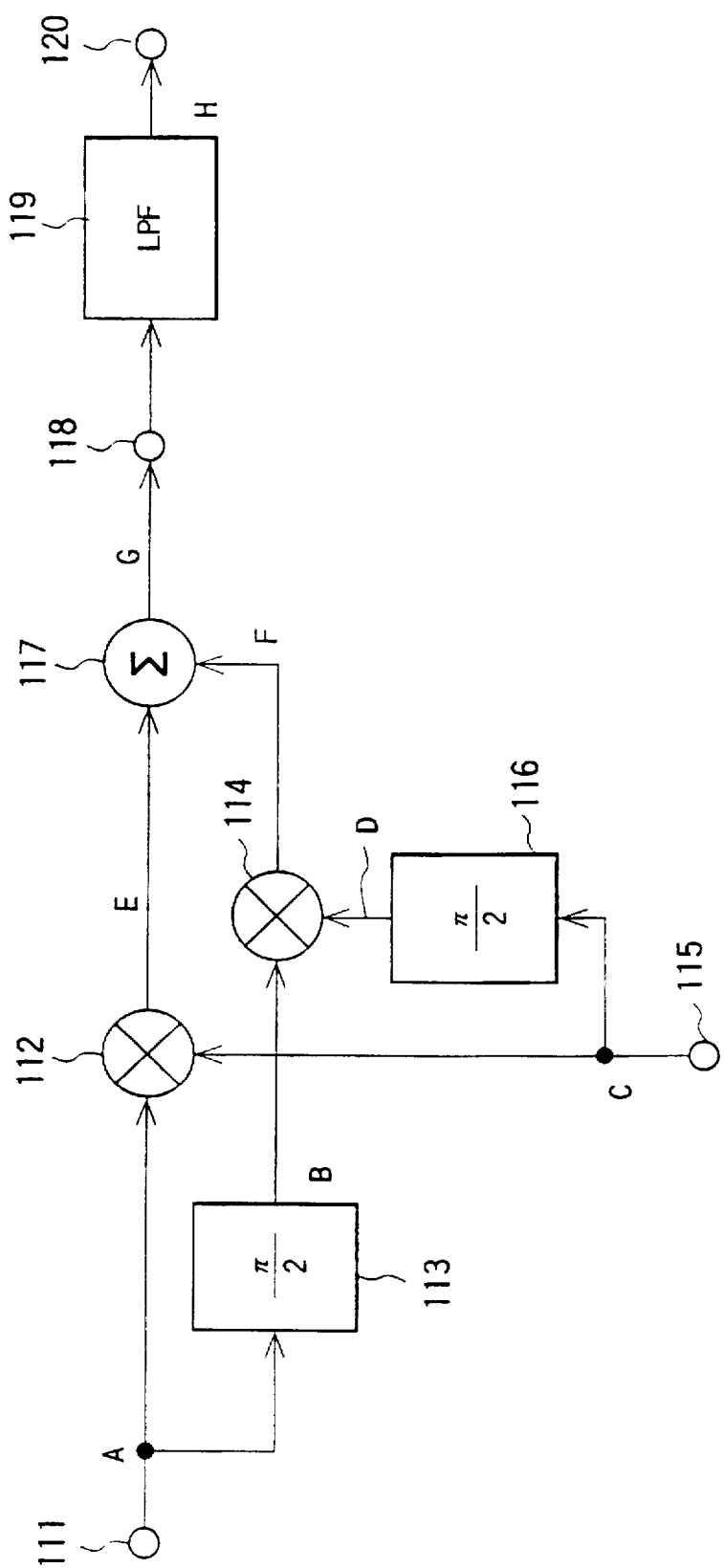
FIG. 1 is a block diagram showing the conventional frequency converting circuit.
Figure 2:
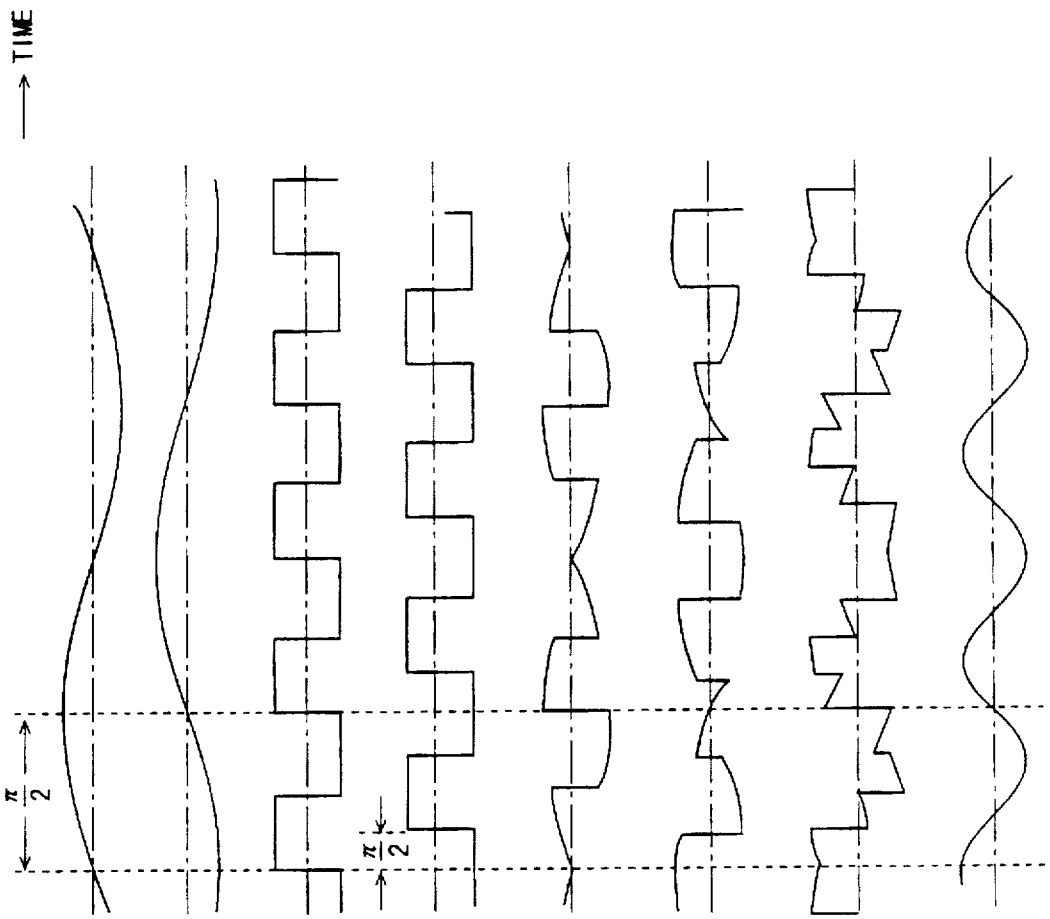
FIGS. 2A to 2H are signal waveforms for assistance in explaining the operation of the conventional circuit shown in FIG. 1.
Figure 3:
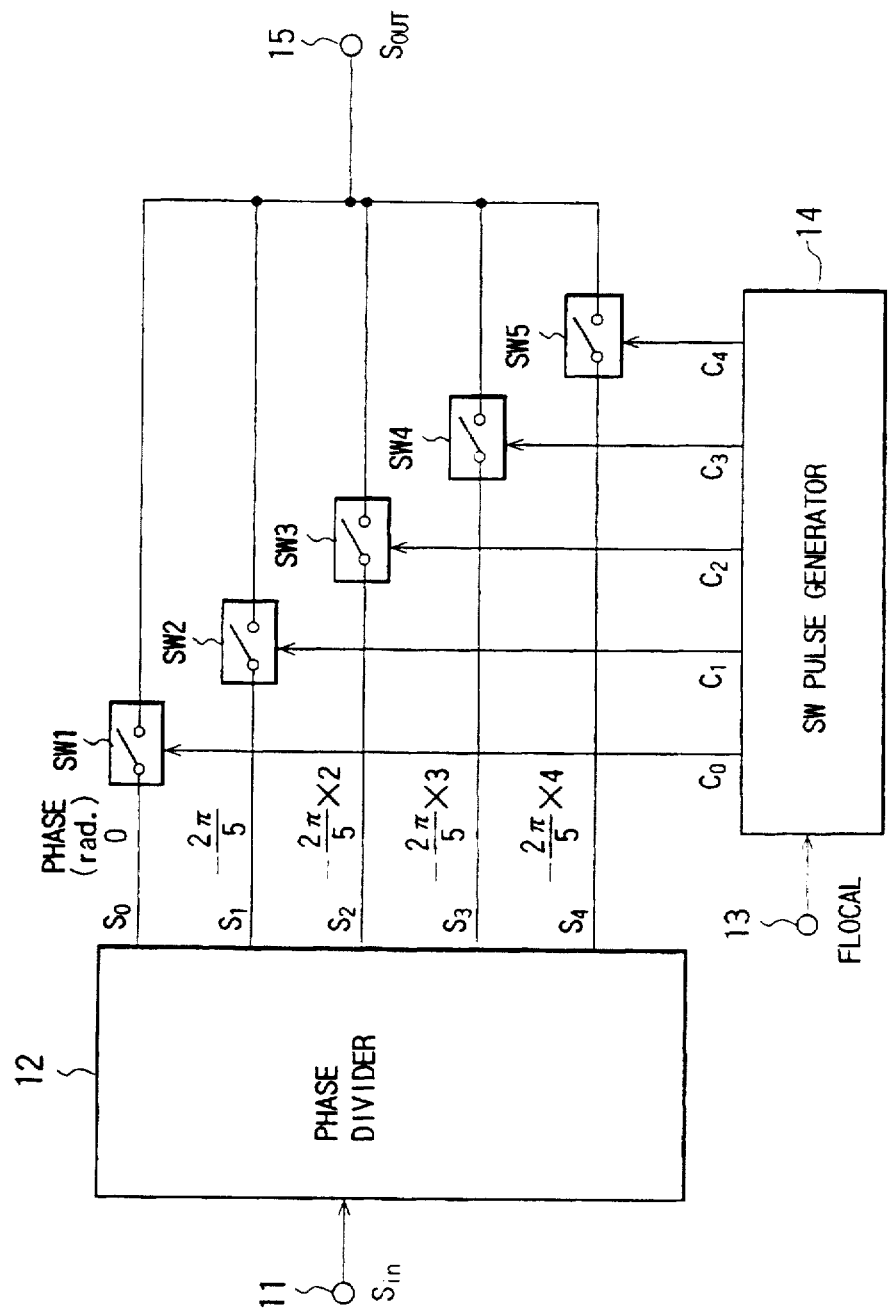
FIG. 3 is a block diagram showing a first preferred embodiment of the frequency converting circuit according to the present invention.

As shown in FIG. 3, the frequency converting circuit as the first embodiment includes a phase divider 12 for dividing a first input signal $S_{in}$ of a frequency f1 into five channel signals, a switching pulse generator 14 for generating five switching pulses $C_0$ to $C_4$ on the basis of a second input signal, and five switching circuits SW1 to SW 5.

Figure 4:
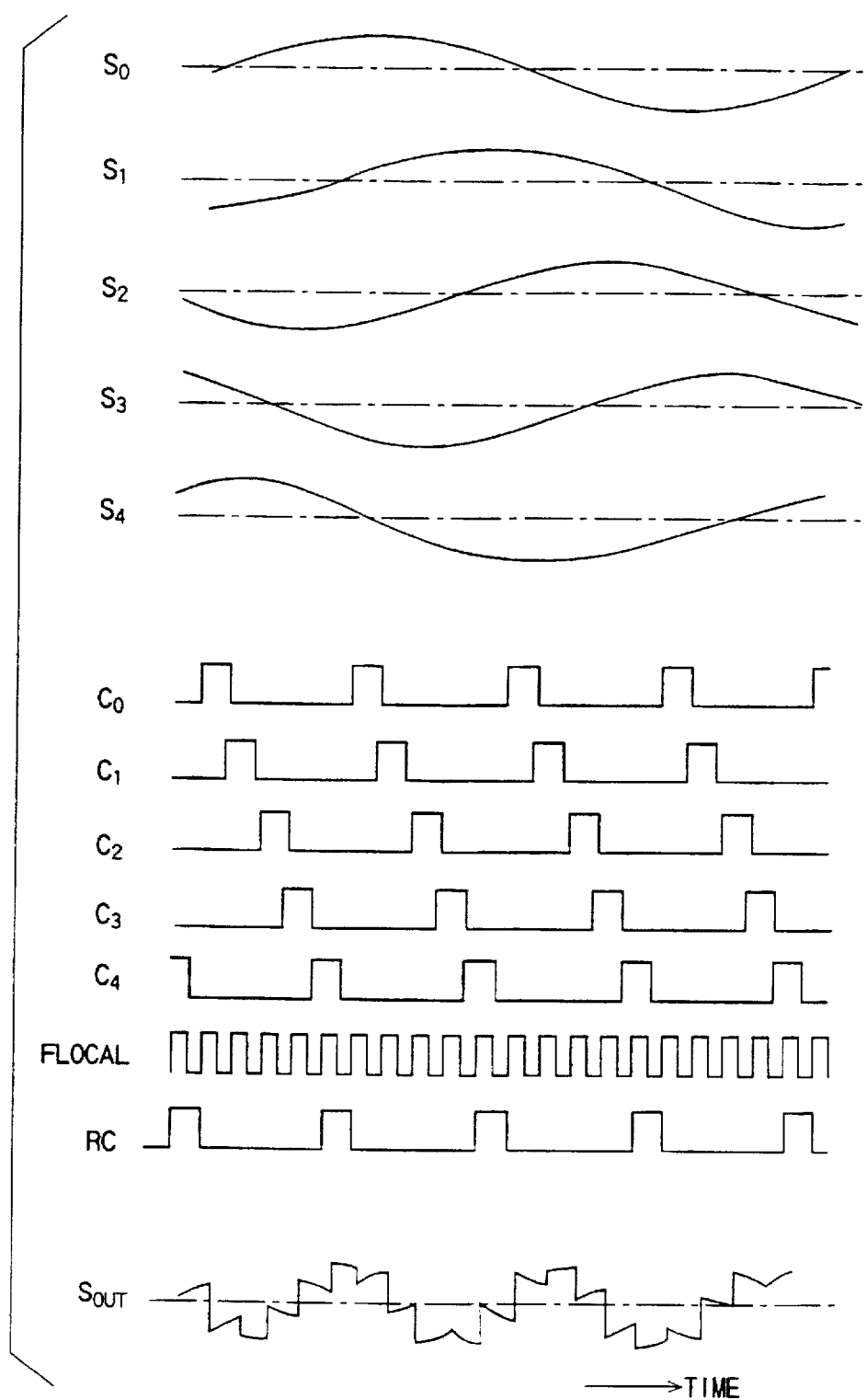
FIG. 4 is a timing chart for assistance in explaining the operation of the circuit shown in FIG. 3.

The operation of the first embodiment will be described hereinbelow with reference to a timing chart as shown in FIG. 4. In FIG. 3, the first input signal $S_{in}$ is supplied via input terminal 11 to the phase divider 12 (described in detail, later with reference to FIG. 5), and then divided into five channel signals $S_0$, $S_1$, $S_2$, $S_3$ and $S_4$ whose phases are different from one another by $2\pi/5$ radian in sequence. The five divided channel signals are outputted to the switching circuits SW1, SW2, SW3, SW4 and SW5. FIG. 4, shows the signal waveforms of these five channel signals $S_0$, $S_1$, $S_2$, $S_3$ and $S_4$, respectively, and their frequencies are f1, e.g. 1 Hz.

Figure 7:
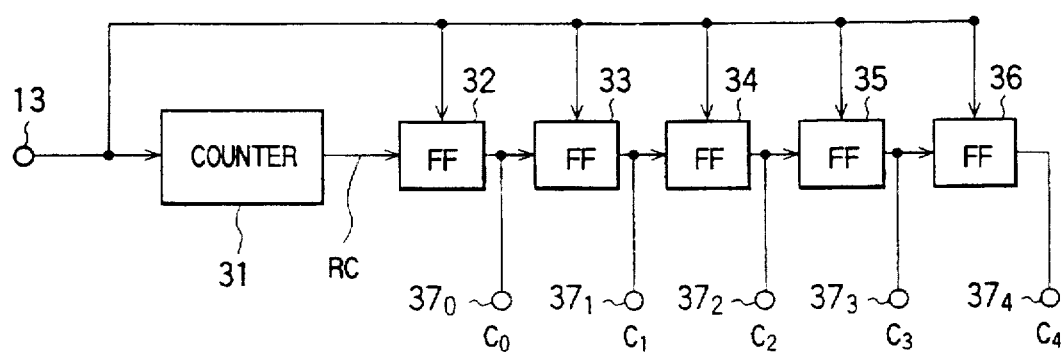
FIG. 7 is a block diagram showing an example of the switching pulse generating circuit shown in FIG. 3.

Further, a second input signal FLOCAL of a frequency five times higher than a local frequency $f_{local}$ is supplied via input terminal 13 to the switching pulse generator 14 (described in detail, later with reference to FIG. 7). The switching pulse generator 14 generates five switching pulses $C_0$, $C_1$, $C_2$, $C_3$ and $C_4$ having a frequency of $f_{local}$ and a pulse width obtained by dividing one period ($1/f_{local}$) into five (each of which phases is different from each other), as shown in FIG. 4. Further, the local frequency $f_{local}$ is a frequency ($4 \times f1$) four times higher than that of the first input signal f1, e.g. 4 Hz.

The five switching circuits SW1 to SW 5 are turned on to pass the inputted channel signals when the inputted five switching pulses $C_0$, $C_1$, $C_2$, $C_3$ and $C_4$ are at a high level, but turned off not to pass the channel signals at a low level. Therefore, a signal $S_{OUT}$ obtained by synthesizing the five channel signals having different phases delayed $2\pi/5$ radian by $2\pi/5$ radian, respectively (as shown in FIG. 4) can be outputted through the switching circuits SW1 to SW5 to a common output terminal 15. The output signal $S_{OUT}$ is a frequency converted signal having a difference frequency ($f_{local}-f1$), that is, having a fundamental frequency of ($3 \times f1$).

Figure 5:
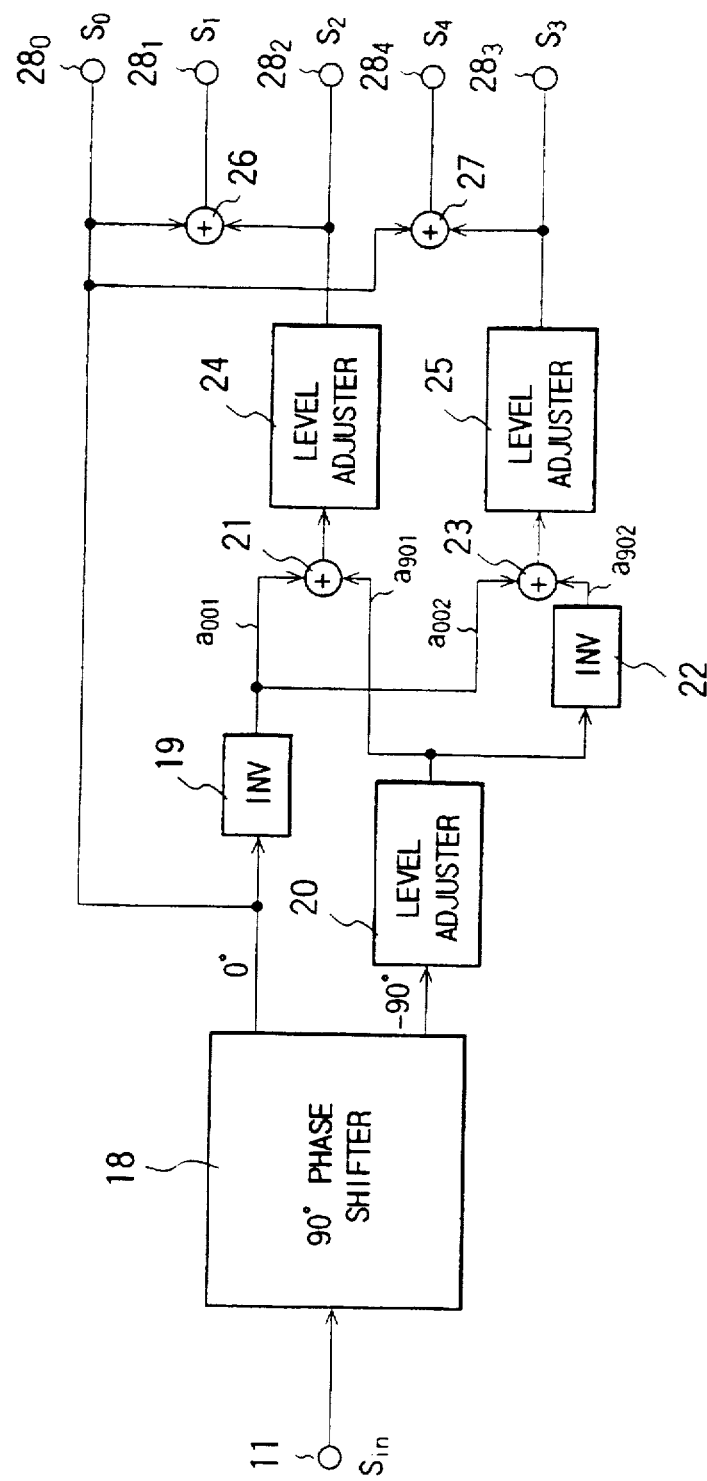
FIG. 5 is a block diagram showing an example of the phase dividing circuit shown in FIG. 3.

The phase divider 12 shown in FIG. 3 will be described in detail hereinbelow with reference to FIGS. 5 and 6. In FIG. 5, the phase dividing circuit 12 includes a 90 degree phase shifter 18, two inversion amplifiers 19 and 22, three level adjusters 20, 24 and 25, and four adders 21, 23, 26 and 27.

In FIG. 5, the first input signal $S_{in}$ supplied via input terminal 11 to the 90 degree phase shifter 18 constructed by a well known Hilbert circuit, and then directly (without any phase shift) outputted therefrom to an output terminal $28_0$ and the adder 21 via inversion amplifier 19 as a first signal. Further, the first input signal $S_{in}$ is shifted by −90 degrees by the 90 degree phase shifter 20. After having being shifted as a second signal, the shifted second signal is supplied to the adder 21 and the inversion amplifier 22 via level adjuster 20. Here, the first signal is outputted as a first channel signal $S_0$ represented by a vector of 0 degrees as shown in FIG. 6, and the second signal is outputted as a signal represented by a vector of −90 degrees as shown in FIG. 6.

The output signal of the inversion amplifier 19 is supplied to the adder 21 and then added to the output signal of the level adjuster 20. The output signal of the inversion amplifier 19 is further supplied to the adder 23 and then added to the output signal of the inversion amplifier 22. The level adjuster 20 executes the level adjustment in accordance with the relationship $(a_{901}/a_{001})=(a_{902}/a_{002})=$tan 36 degrees. Here, $a_{001}$ and $a_{002}$ denote the signals supplied from the inversion amplifier 19 to the adders 21 and 23, respectively. $a_{901}$ the signal supplied from the level adjuster 20 to the adder 21, and $a_{902}$ the signal supplied from the inversion amplifier 22 to the adder 23.

Figure 6:
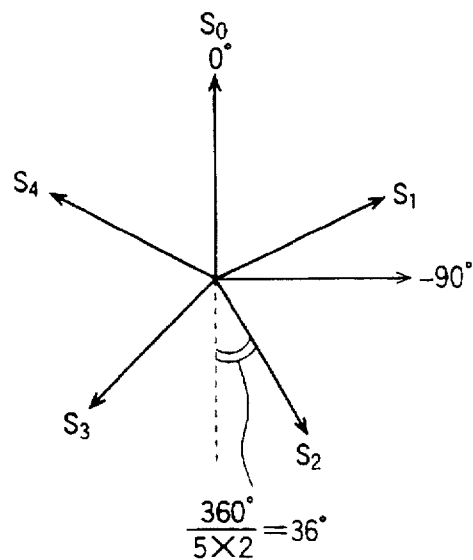
FIG. 6 is a vector diagram for assistance in explaining the operation of the phase dividing circuit shown in FIG. 5.

The level of the output signal of the adder 21 is adjusted by the level adjuster 24 so as to become that obtained at the zero degrees, and then outputted via output terminal $28_2$ as the third channel signal represented by a vector $S_2$ as shown in FIG. 6. The third channel signal $S_2$ is supplied to the adder 26, added to the first channel signal $S_0$, and then outputted via output terminal $28_1$ as the second channel signal represented by a vector $S_1$ as shown in FIG. 6. Here, the sign, for example, $S_1$ denotes both the second channel signal shown in FIG. 5 and the vector $S_1$ shown in FIG. 6.

Further, the level of the output signal of the adder 23 is adjusted by the level adjuster 25 so as to become that obtained at the zero degrees, and then outputted via output terminal $28_3$ as the fourth channel signal represented by a vector $S_3$ as shown in FIG. 6. The fourth channel signal is supplied to the adder 27, added to the first channel signal $S_0$, and then outputted via output terminal $28_4$ as the fifth channel signal represented by a vector $S_4$ as shown in FIG. 6.

Next, the switching pulse generator 14 shown in FIG. 3 will be described in detail hereinbelow with reference to FIG. 7. The switching pulse generator includes a counter 31 and five cascade-connected D-type flip-flop (FF) 32 to 36, as shown in FIG. 7. Here, as the counter 31, a well known circuit such as a TTL standard logic IC (e.g., 74LS163 or 74F163) can be used.

A square waveform signal FLOCAL having a frequency of $5 \times f_{local}$ as shown in FIG. 4 is supplied to a clock input of the counter 31. When the counter 31 counts the count value "5", a ripple carry output signal RC as shown in FIG. 4 can be obtained. The RC signal is supplied to a D input terminal of the D-type FF 32. When the signal FLOCAL is supplied to the clock input of the FF 32, a signal $C_0$ as shown in FIG. 4 is generated from a Q output of the FF 32 and outputted via output terminal $37_0$. The signal $C_0$ is supplied to a D input terminal of the succeeding stage FF 33. The signal $C_0$ is latched by the signal FLOCAL to obtain the signal $C_1$ from a Q output terminal of the FF 33. The signal $C_1$ is outputted via output terminal $37_1$.

In the same way as above, when Q outputs of the flip-flops 33, 34 and 35 are supplied to D input terminals of the FF 34, 35 and 36, respectively in sequence and when the signal FLOCAL is supplied to their clock input terminals, signals $C_2$, $C_3$ and $C_4$ as shown in FIG. 4 are generated from Q output terminals of the FF 34, 35 and 36, respectively. These signals $C_2$ to $C_6$ are outputted via output terminals $37_2$ to $37_4$, respectively.

As shown in FIG. 4, each of the signals $C_0$ to $C_4$ is at the high level at a period of $(1/f_{local})$ during a time interval obtained by dividing the period of $(1/f_{local})$ into five, so that the phases of the high levels of the five signals $C_0$ to $C_4$ are shifted one by one for each ⅕ period of $(1/f_{local})$. The switching circuits SW1 to SW5 shown in FIG. 3 are switched on the basis of the pulses $C_0$ to $C_4$, to obtain the output signal $S_{OUT}$ having a fundamental frequency of a difference frequency component $(f_{local}-f1)$ It is possible to obtain the output signal having a fundamental frequency of $(f_{local}+f1)$. In this case, the phase divider 12 is so constructed as to generate the channel signals $S_0$ to $S_4$ in such a way that their phases are advanced $2\pi/5$ by $2\pi/5$ radian; and the switching pulse generator 15 is so constructed as to output the pulses $C_0$ to $C_4$ in such a way that the phases of the high level signals are advanced one by one.

A second embodiment of the frequency converting circuit according to the present invention will be described hereinbelow with reference to FIGS. 8 to 11.

Figure 8:
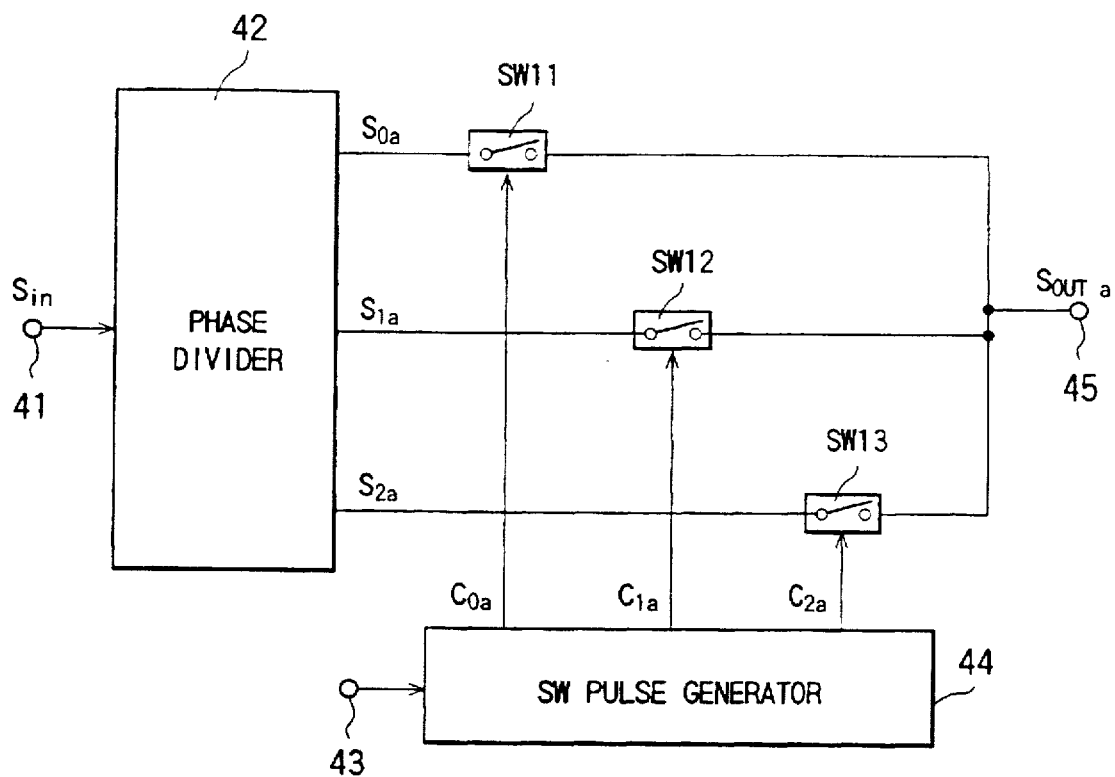
FIG. 8 is a block diagram showing a second preferred embodiment of the frequency converting circuit according to the present invention.

As shown in FIG. 8, the frequency converting circuit includes a phase divider 42 for dividing a first input signal $S_{in}$ into three signals, a switching pulse generator 44 for generating three switching pulses $C_{0a}$ to $C_{2a}$ on the basis of a second input signal supplied via input terminal 43, and three switching circuits SW11 to SW 13.

Figure 9:
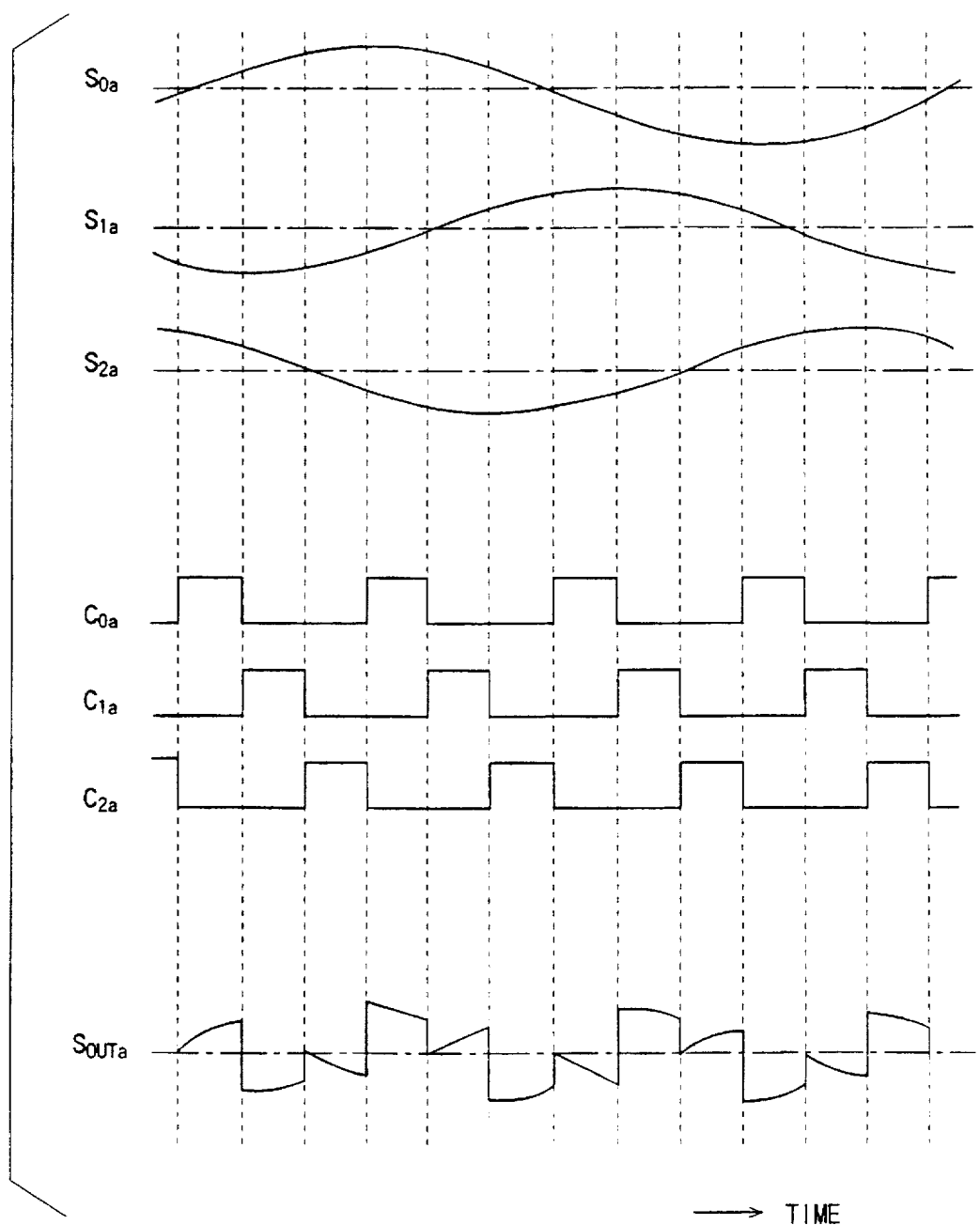
FIG. 9 is a timing chart for assistance in explaining the operation of the circuit shown in FIG. 8.

In FIG. 9, the first input signal $S_{in}$ inputted via input terminal 41 is supplied to the phase divider 42 (described in detail, later with reference to FIG. 10), and then divided into three channel signals $S_{0a}$, $S_{1a}$ and $S_{2a}$. Their phases are different from one another $2\pi/3$ by $2\pi/3$ radian in sequence. The channel signals $S_{0a}$, $S_{1a}$ and $S_{2a}$ are outputted to the switching circuits SW11, SW12 and SW13, respectively. FIG. 9. shows the signal waveforms of the channel signals $S_{0a}$, $S_{1a}$ and $S_{2a}$, respectively, having the frequency f1, e.g. 1 Hz.

On the other hand, a second input signal is supplied for frequency conversion via input terminal 43 to the switching pulse generator 44. The second input signal has a frequency $F_{LOCALa}$ three times higher than a local frequency $f_{local}$. The switching pulse generator 44 generates three switching pulses $C_{0a}$, $C_{1a}$ and $C_{2}$a having a frequency of $f_{local}$ and a pulse width obtained by dividing one period $(1/f_{local})$ into three. The phases of the switching pulses $C_{0a}$, $C_{1a}$ and $C_{2a}$ are different from one another as shown in FIG. 9. Further, the switching pulses $C_{0a}$, $C_{1a}$ and $C_{2a}$ are supplied to the switching circuits SW11 to SW13, respectively.

The three switching circuits SW 11, SW12 and SW 13 are turned on to pass the inputted channel signals when the switching pulses $C_{0a}$, $C_{1a}$ and $C_{2a}$ are at a high level, but turned off not to pass the channel signals a low level. The channel signals $S_{0a}$, $S_{1a}$ and $S_{2a}$ having different phases delayed $2\pi/3$ by $2\pi/3$ radian as shown in FIG. 9 are synthesized with each other to output a signal $S_{OUTa}$ via common output terminal 45. The output signal $S_{OUTa}$ is a frequency converted signal having a difference frequency $(f_{local}-f1)$ that is, having a fundamental frequency of $(3 \times f1)$.

Figure 10:
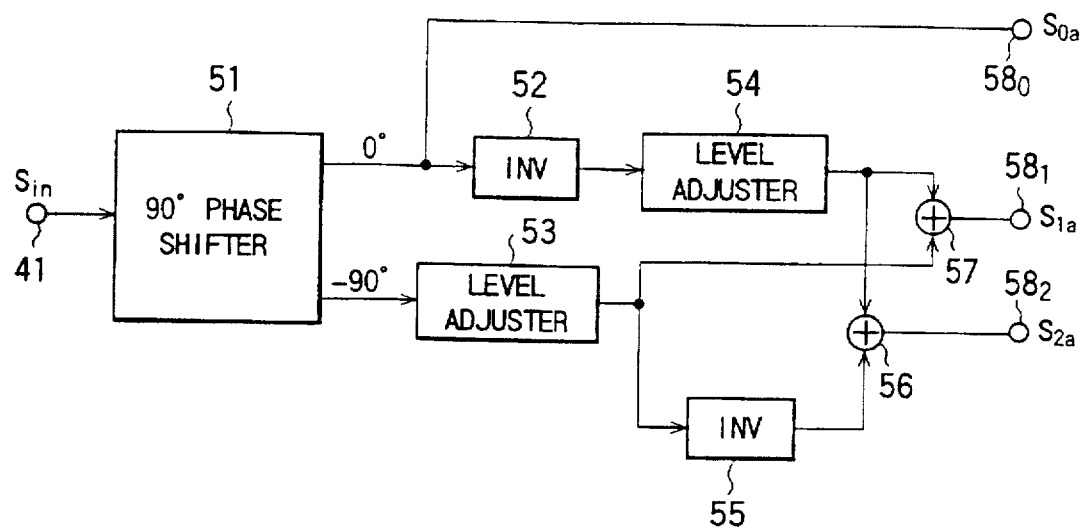
FIG. 10 is a block diagram showing an example of the phase dividing circuit shown in FIG. 8.
Figure 11:
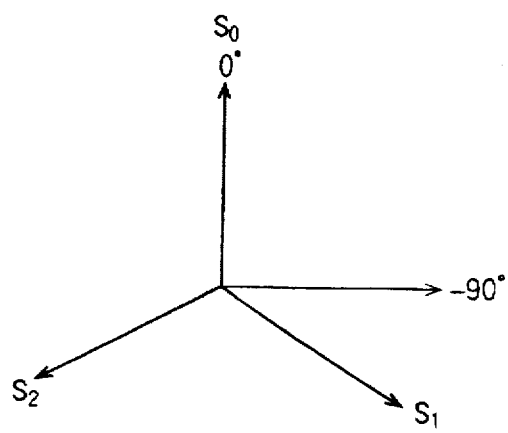
FIG. 11 is a vector diagram for assistance in explaining the operation of the phase dividing circuit shown in FIG. 10.

The phase divider 42 shown in FIG. 8 will be described in detail hereinbelow with reference to FIGS. 10 and 11. In FIG. 10, the phase divider 42 includes a 90 degree phase shifter 51, two inversion amplifiers 52 and 55, two level adjusters 53 and 54, and two adders 56 and 57.

The first input signal $S_{in}$ is supplied via input terminal 41 to the 90 degree phase shifter 51 constructed by a well known Hilbert circuit. The signal $S_{in}$ is outputted as it is from the 90 degree phase shifter 51 to an output terminal $58_0$ and is supplied to the inversion amplifier 52 as a first signal.

The first input signal $S_{in}$ is further shifted by −90 degrees as a second signal by the 90 degree phase shifter 51. The second signal is supplied to the adder 57 and the inversion amplifier 55 via level adjuster 53. Here, as shown in FIG. 11, the first signal is outputted as a first channel signal $S_{0a}$ represented by a vector of 0 degrees, and the second signal is outputted as a signal represented by a vector of −90 degrees.

The output signal of the inversion amplifier 52 is supplied to the adder 57 via level adjuster 54 and then added to the output signal of the level adjuster 53. The output signal of the adder 57 is outputted via output terminal $58_1$ as a second channel signal represented by a vector $S_{1aa}$ in FIG. 11. Further, the output signal of the adder 56 is outputted via output terminal $58_2$ as a third channel signal represented by a vector $S_{2a}$ as shown in FIG. 11.

As described above, in this second embodiment, since the switching circuit includes only three switching circuits SW11 to SW13 as shown in FIG. 8, the circuit construction can be simplified. The frequency converting circuit previously proposed by the applicant includes three switching circuits in the case of the four-phase switching. However, each switching circuit is of two-way switching circuit, the construction of each switching circuit is rather complicated. On the contrary, in the first and second embodiments as shown in FIGS. 3 and 8, the switching circuits are all of single-way switch simply turned on or off. It is thus possible to simplify the construction of each switching circuit.

Figure 12A:
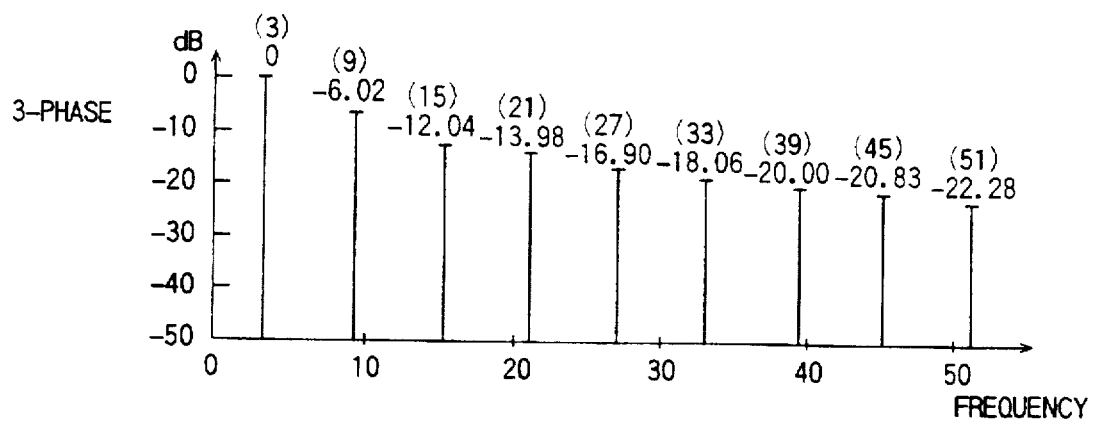
FIGS. 12A, 12B and 12C are histograms each showing the frequency spectrum of the first and second embodiments shown in FIGS. 3 and 8, respectively.
Figure 12B:
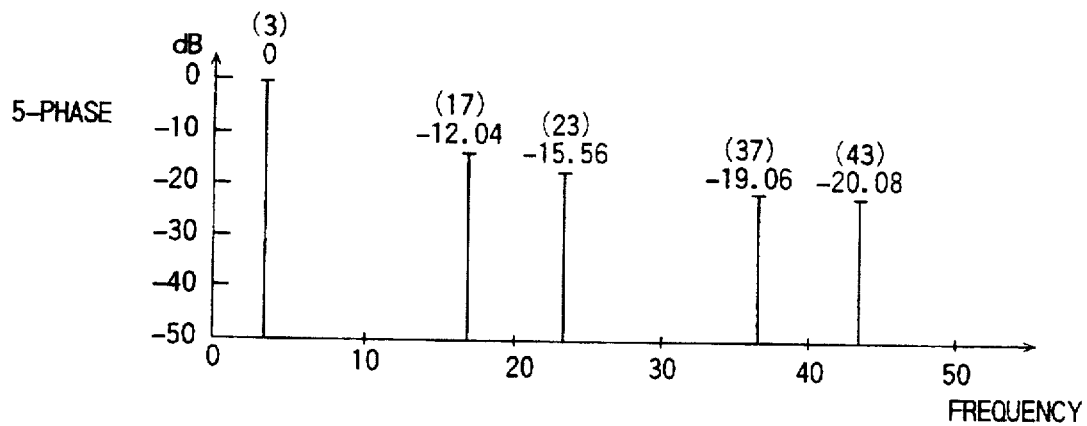
Figure 12C:
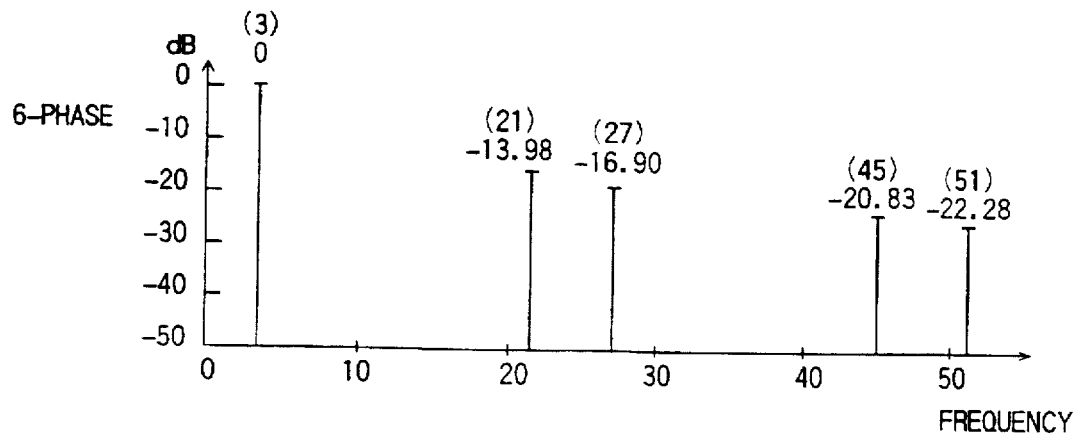

FIGS. 12A to 12C show the frequency spectra obtained by executing the fast Fourier transformation (FFT) for the frequency converted output signals $S_{OUT}$ obtained by the frequency converting circuit according to the present invention, on condition that $f_{local}$ is 4 f1 and $S_{in}$ is f1.

Figure 13A:
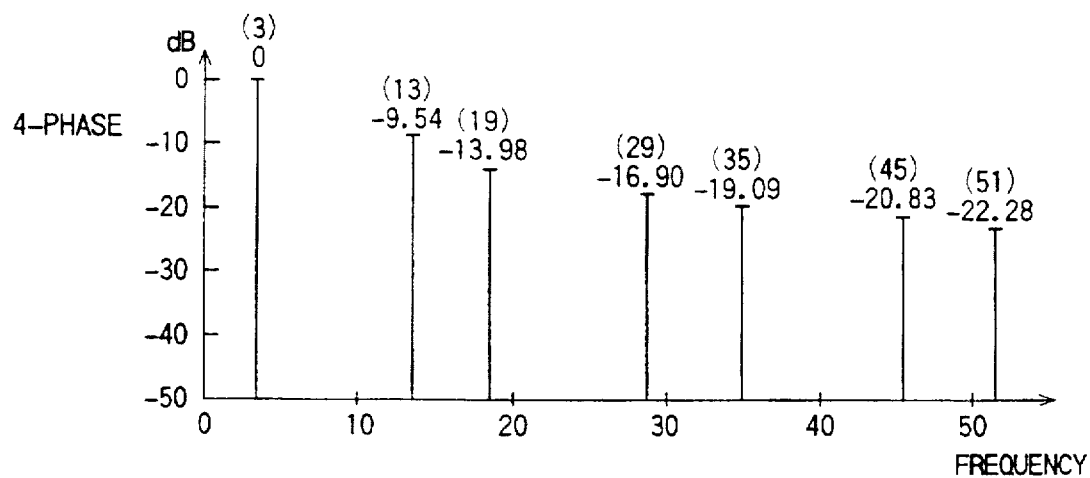
FIGS. 13A and 13B are examples each showing the frequency spectrum of the frequency converting circuit previously proposed by the applicant.
Figure 13B:
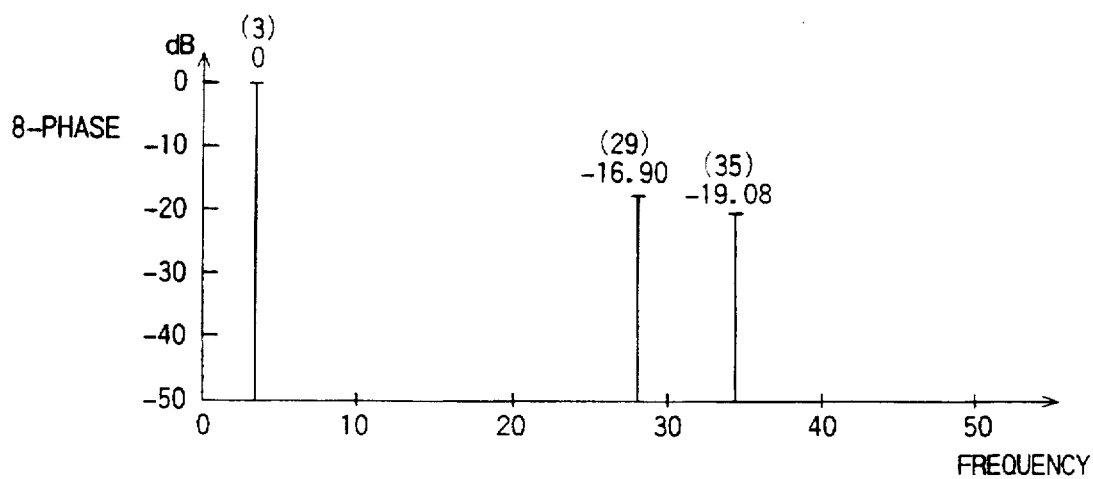

On the other hand, FIGS. 13A and 13B show the frequency spectra obtained by executing the FFT for the frequency converted output signals $S_{OUT}$ obtained by the frequency converting circuit previously proposed by the applicant.

In these frequency spectrum diagrams shown in FIGS. 12A, 12B and 12C and FIGS. 13A and 13B, each numeral with a parenthesis on the upper side of each frequency component indicates the magnification to the frequency f1 (i.e., 1 Hz) of the first input signal $S_{in}$. Further, each numeral represented without any parenthesis indicates a level designated by dB (decibel) relative to the fundamental frequency of the output signal $S_{OUT}$. Further, FIGS. 12A, 12B and 12C show the cases where the number of the divided phases are three (as shown in FIG. 8), the five (as shown in FIG. 3) and six, respectively. Further, FIGS. 13A and 13B show the cases where the number of divided phases are four and eight, respectively.

FIGS. 12A to 12C and FIGS. 13A and 13B indicate that each output signal includes the difference frequency ($f_{local}-S_{in}$)=3 f1 (=3 Hz) as the fundamental frequency, irrespective of the number of divided phases. However, the frequency components of the addition frequency 5 f1 (=5 Hz) are not included in the output signals.

In the frequency converting circuit according to the present invention, the lowest high-frequency is 9 f1 (=9 Hz) which corresponds to ($2f_{local}-S_{in}$), as shown in FIG. 12A, even in the case of three phase switching. On the other hand, In the frequency converting circuit previously proposed by the applicant, the lowest high-frequency is 13 f1, as shown in FIG. 13A, in the case of four phase switching. Therefore, there exists no big difference between 9 f1 and 13 f1, so that the lowest high-frequency can be removed easily by use of a LPF.

Further, in the case of five-phase switching of the frequency converting circuit according to the present invention, the lowest high-frequency component is 17 Hz as shown in FIG. 12B. This is higher than 13 Hz of four-phase switching of the frequency converting circuit previously proposed by the applicant as shown in FIG. 13A. As a result, the frequency converting circuit according to the present invention can remove the high frequency components by use of a simple LPF having gently sloped frequency characteristics, as compared with the circuit previously proposed by the applicant.

In the frequency converting circuit according to the present invention as described above, without being limited only to the three- or five-phases division, the number of the phases to be divided can be determined freely up to six or more. Furthermore, the number of the phases to be divided can be determined under due consideration of how the output signal $S_{out}$ is transformed to the sine wave before filtering or how the frequency converting circuit becomes complex. Consequently, there exists such an advantage that the degree of design freedom can be increased.

Figure 14:
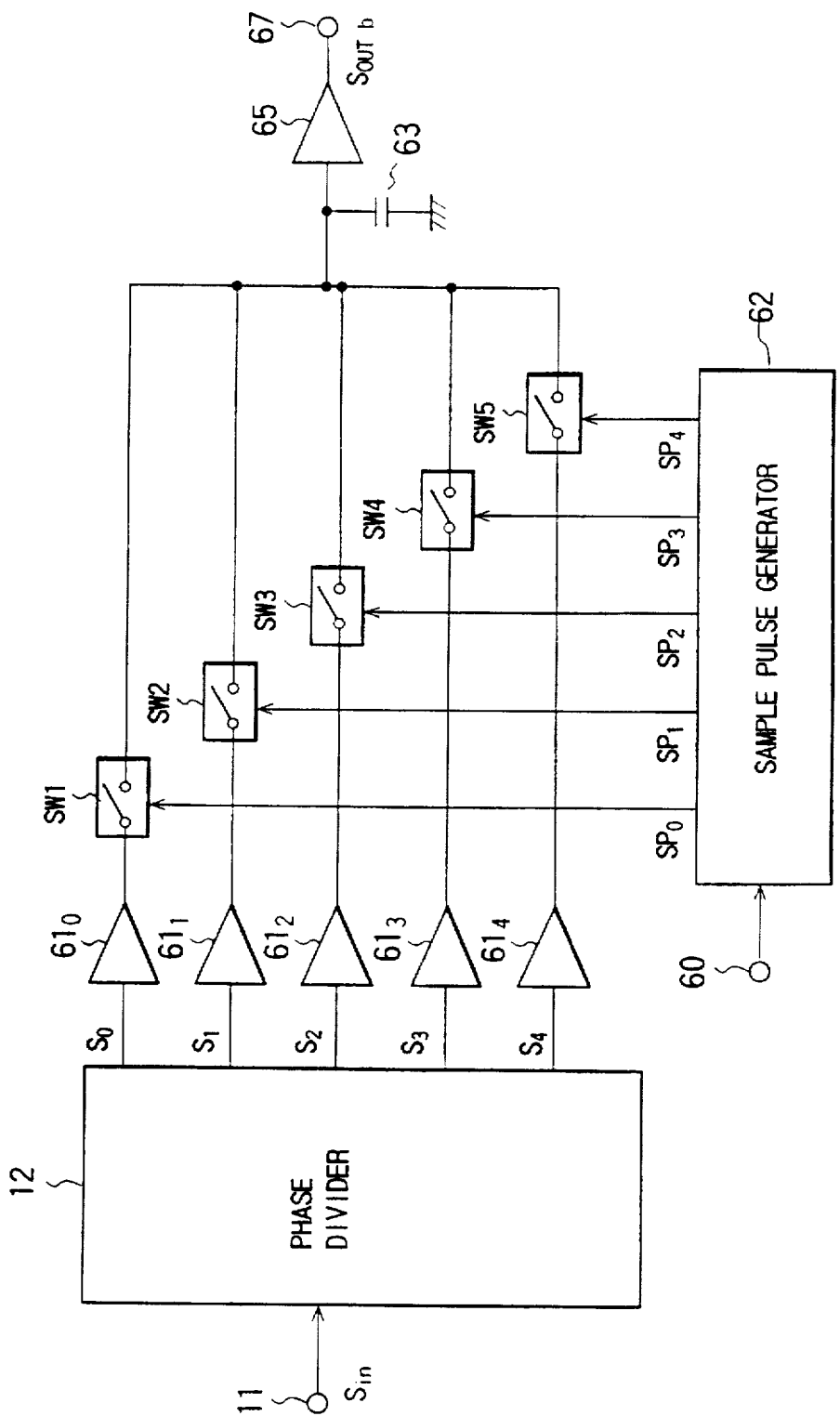
FIG. 14 is a block diagram showing a third preferred embodiment of the frequency converting circuit according to the present invention.

A third embodiment of the frequency converting circuit according to the present invention will be described hereinbelow with reference to FIGS. 14 and 15. In FIG. 14, the same reference numerals are retained for similar elements having the same functions as with the case of the first embodiment shown in FIG. 3, without repeating the similar description thereof.

Being different from the first embodiment, in this third embodiment, five buffer amplifiers $61_0$, $61_1$, $61_2$, $61_3$ and $61_4$ each having a high input impedance and a low output impedance are provided on the output side of the phase divider 12. In addition, a capacitor 63 and a buffer amplifier 65 are provided on the output side of the five switching circuits SW1, SW2, SW3, SW4 and SW5. The five switching circuits SW1, SW2, SW3, SW4 and SW5 are each activated for switching or sampling operation by a sampling pulse generator 62.

Figure 15:
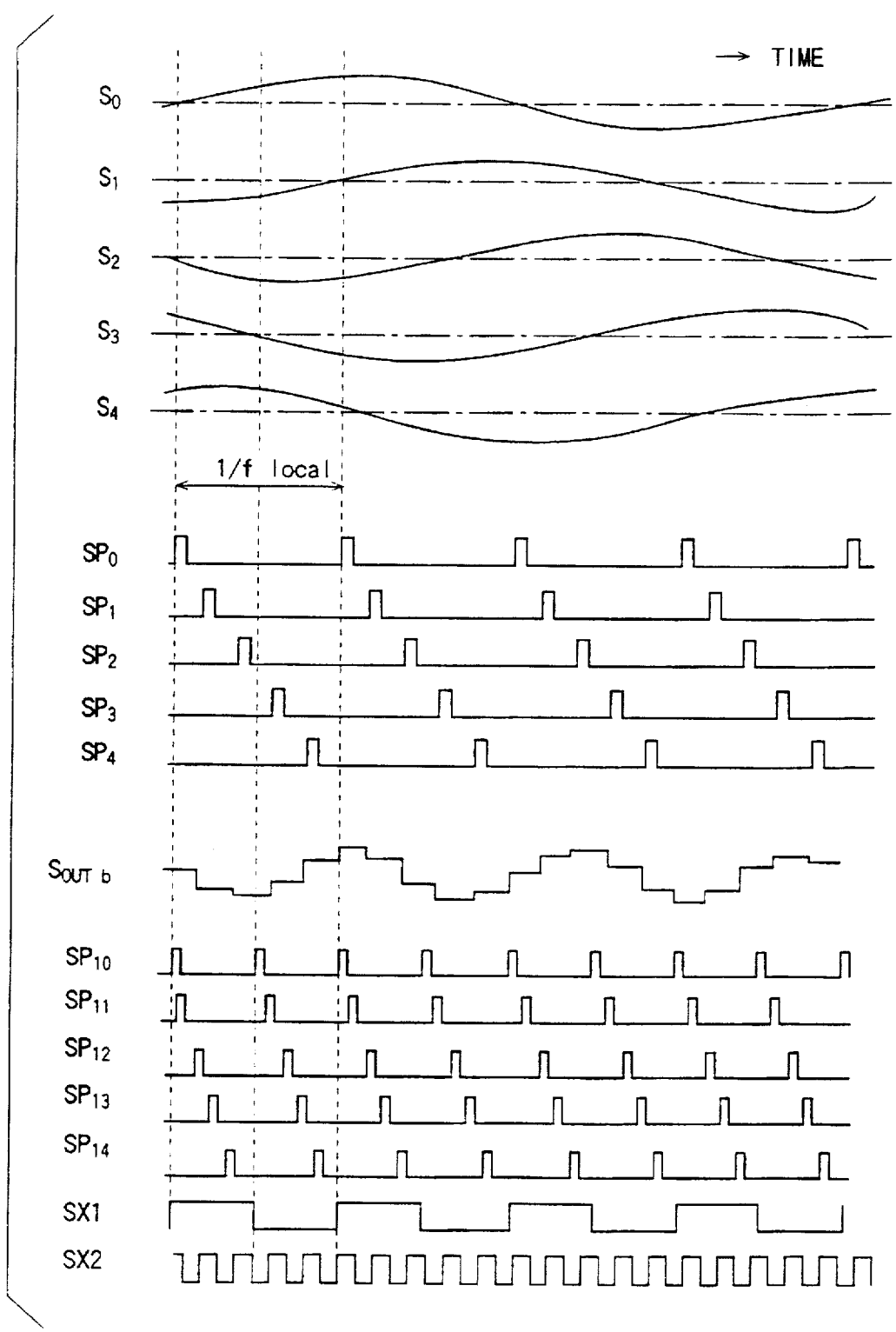
FIG. 15 is a timing chart for assistance in explaining the operation of the circuit shown in FIG. 14.

A first input signal $S_{in}$ is divided by the phase divider 12 into five channel signals $S_0$, $S_1$, $S_2$, $S_3$ and $S_4$ as shown in FIG. 15. The channel signals $S_0$, $S_1$, $S_2$, $S_3$ and $S_4$ are supplied via buffer amplifiers $61_0$ to $61_4$ to the switching circuits SW1, SW2, SW3, SW4 and SW5, respectively.

On the other hand, a second input signal having a local frequency $f_{local}$ is supplied via input terminal 60 to the sampling pulse generator 62 that is described in detail with reference to FIG. 16. The sampling pulse generator 62 generates five sampling pulses $SP_0$, $SP_1$, $SP_2$, $SP_3$ and $SP_4$ having a frequency of $f_{local}$ and a narrow pulse width, as shown in FIG. 15. The local frequency $f_{local}$ is a frequency 4 f1 four times higher than the frequency f1 (e.g., 4 Hz) of the first input signal $S_{in}$. These sampling pulses are supplied to the corresponding switching circuits SW1, SW2, SW3, SW4 and SW5, respectively.

The switch circuits SW1, SW2, SW3, SW4 and SW 5 are turned on to pass the inputted channel signals $S_0$, $S_1$, $S_2$, $S_3$ and $S_4$ when the inputted sampling pulses $SP_0$, $SP_1$, $SP_2$, $SP_3$ and $SP_4$ are at a high level, but turned off not to pass the channel signals at a low level. The channels signals outputted by the switching circuits SW1, SW2, SW3, SW4 and SW5 are supplied to the capacitor 63 that holds these signals.

The voltage held by the capacitor 63 is outputted to an output terminal 67 via the buffer amplifier 65. The outputted signal is a signal $S_{OUTb}$ obtained by synthesizing the five channel signals each of whose phases is delayed $2\pi/5$ by $2\pi/5$ radian, as shown in FIG. 15. The output signal $S_{OUTb}$ is a frequency converted signal having a difference frequency ($f_{local}-S_{in}$), that is, having a fundamental frequency of 3 f1. Therefore, it is possible to obtain the frequency components of ($f_{local}-S_{in}$) when this output signal $S_{OUTb}$ is passed through a LPF.

The sampling pulse generator 62 shown in FIG. 14 will be described in detail with reference to FIG. 16. In this figure, the same reference numerals are retained for similar elements having the same functions as with the case of the first embodiment shown in FIG. 7, without repeating the similar description.

Figure 16:
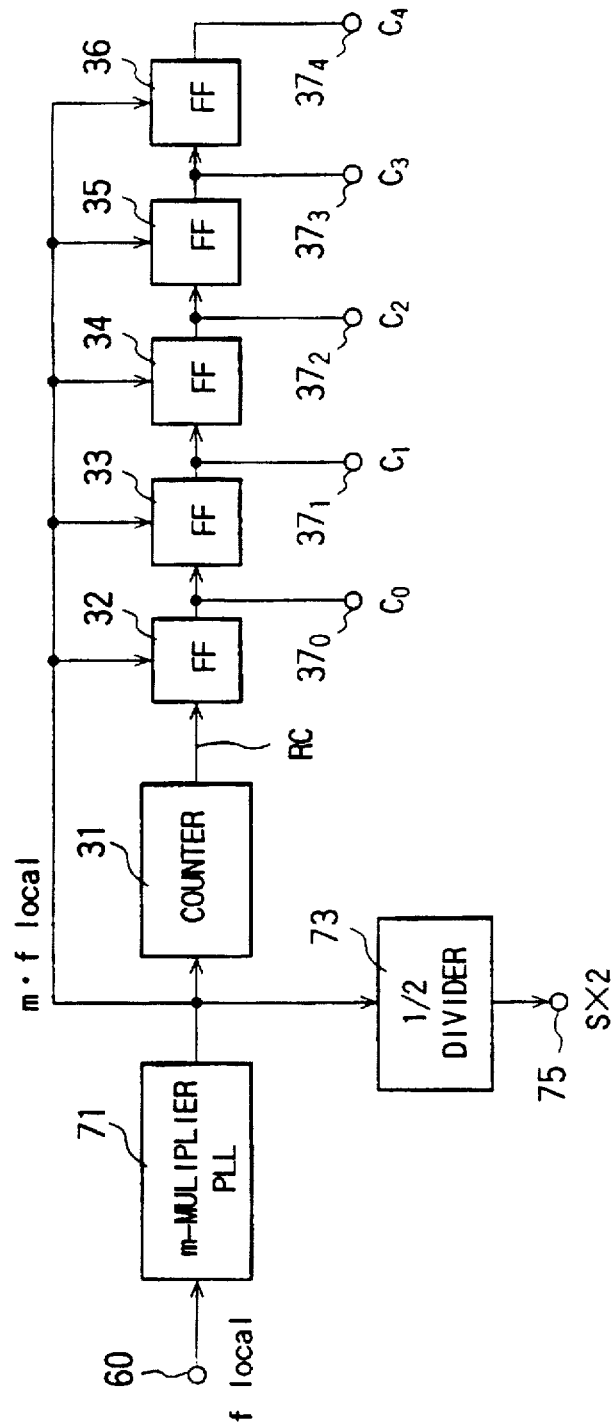
FIG. 16 is a block diagram showing an essential portion of the sampling pulse generator shown in FIG. 14.

As shown in FIG. 16, the sampling pulse generating circuit 62 includes a phase locked loop (PLL) 71, a counter 31, five-stage cascade connected D-type flip-flops (FF) 32 to 36, and a ½ frequency divider 73.

The second input signal having the local frequency $f_{local}$ is supplied via input terminal 60 to the PLL 71. A square waveform signal having a frequency of 5 $f_{local}$ is outputted by the PLL 71 and is supplied to a clock input of the counter 31 in which the count number "5" is set. A signal RC as shown in FIG. 4 is ten obtained as a ripple carry output. Further, signals $C_0$, $C_1$, $C_2$, $C_3$ and $C_4$ as shown in FIG. 4 are obtained from Q outputs of the FF 32, 33, 34, 35 and 36, respectively. Further, the signal having the frequency of 5 $f_{local}$ outputted by the PLL 71 is divided by the ½ frequency divider 73 to generate a signal SX2 as shown in FIG. 15 that is outputted via output terminal 75.

Each of the signals $C_0$ to $C_4$ is supplied to a two-input AND circuit 84 via input terminal 82 as shown in FIG. 17. In addition, each of the signals $C_0$ to $C_4$ is delayed by a predetermined time τ through a delay circuit 85, inverted by an inverter 86, and then inputted to another input terminal of the AND circuit 84. Here, when the k-the signal $C_k$ inputted to the input terminal 82 among the signals $C_0$ to $C_4$ is assumed to be represented as shown in FIG. 18A, the output signal of the inverter 86 is a signal as shown in FIG. 18B. Thus, the signal outputted to an output terminal 88 of the AND circuit 84 is a sampling signal $SP_k$ having a pulse width τ, as shown in FIG. 8C, which is equivalent to the delay time of the delay circuit 85.

In the third embodiment, the number of divided phases is five. Without being limited only thereto, however, any number of divided phases more than three can be obtained.

Tables 1 to 3 list the high frequency components of the output signals $S_{OUTb}$ obtained as described above for comparison between the first to third embodiments and the frequency converting circuit previously proposed by the applicant. In these tables, A represents the high frequency component of each output signal in each phase conversion by the previously proposed frequency converting circuit; B represents the high frequency component of each output signal in each phase conversion by the frequency converting circuit of the first or second embodiment; and C represents the high frequency component of each output signal in each phase conversion by the frequency converting circuit of the third embodiment. The high frequency components of the output signals are represented in unit of level (dB) relative to that of the fundamental frequency ($f_{local}$–$S_{in}$) of the converted signal, where $S_{in}$ is 1 Hz and $f_{local}$ is 4 Hz. Further, C–B represents a differences between the high frequency component of the output signal of the third embodiment C and that of the output signal of the first or second embodiment B.

TABLE 1

| 4-PHASE SW FREQ | A | B | C | C–B |
|---|---|---|---|---|
| 13 | –9.54 | –9.54 | –12.74 | –3.20 |
| 19 | –13.98 | –13.98 | –16.03 | –2.05 |
| 29 | –16.90 | –16.90 | –19.70 | –2.80 |
| 35 | –19.08 | –19.08 | –21.34 | –2.26 |
| 45 | –20.83 | –20.83 | –23.52 | –2.69 |

TABLE 1-continued

| 4-PHASE SW FREQ | A | B | C | C–B |
|---|---|---|---|---|
| 51 | –22.28 | –22.28 | –24.61 | –2.33 |

TABLE 2

| 5-PHASE SW FREQ | A | B | C | C–B |
|---|---|---|---|---|
| 17 | — | –12.04 | –15.07 | –3.03 |
| 23 | — | –15.56 | –17.69 | –2.13 |
| 37 | — | –19.08 | –21.82 | –2.74 |
| 43 | — | –20.83 | –23.13 | –2.30 |
| 57 | — | –22.92 | –25.57 | –2.65 |
| 63 | — | –24.08 | –26.44 | –2.36 |

TABLE 3

| 3-PHASE SW FREQ | A | B | C | C–B |
|---|---|---|---|---|
| 9 | — | –6.02 | –9.54 | –3.52 |
| 15 | — | –12.04 | –13.98 | –1.94 |
| 21 | — | –13.98 | –16.90 | –2.92 |
| 27 | — | –16.90 | –19.08 | –2.18 |
| 33 | — | –18.06 | –20.83 | –2.77 |
| 39 | — | –20.00 | –22.28 | –2.28 |

Tables 1 to 3 indicate that the high frequency components of the third embodiment as shown in FIG. 14 are lower by 2 to 3 dB than those of the first and second embodiments shown in FIGS. 3 and 8. This shows that it is possible to obtain the output signals of less noise in the case of the third embodiment.

Figure 19:
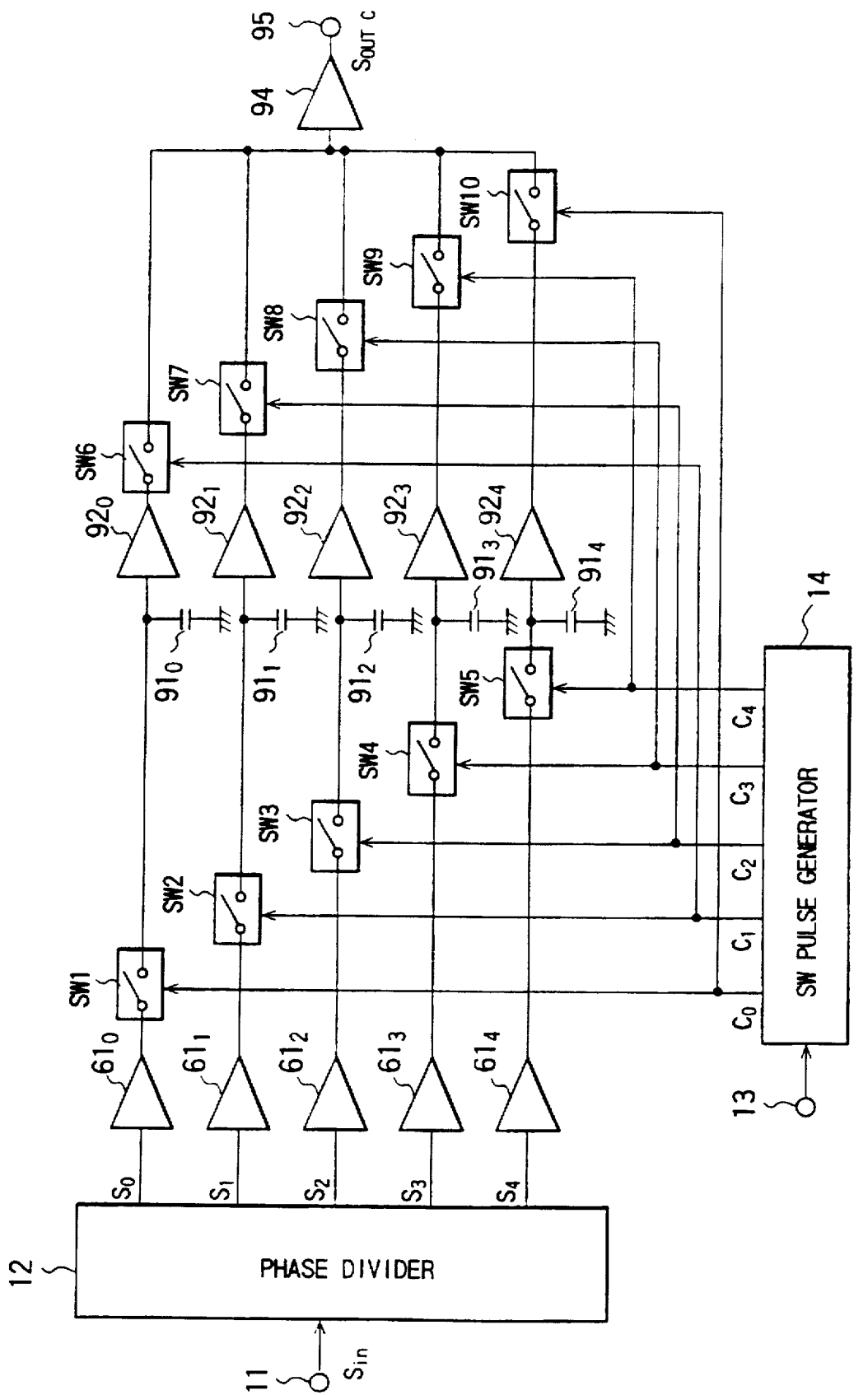
FIG. 19 is a block diagram showing a modification of the third embodiment shown in FIG. 14.

FIG. 19 shows a modification of the third embodiment shown in FIG. 14. In this figure, the same reference numerals are retained for similar elements having the same functions as with the case of the third embodiment, without repeating the similar description.

In this modification, the pulses $C_0$, $C_1$, $C_2$, $C_3$ and $C_4$ as shown in FIG. 3 are used as the sampling pulses. An average value of each of these pulses during the period ($1/f_{local}$)×⅕ is charged in each of capacitors $91_0$ to $91_4$ through the switching circuits SW1 to SW5, respectively. Further, at the succeeding timing of the above-mentioned period, each charged value is supplied to the buffer amplifiers 94 through each of the buffer amplifier $92_0$ to $92_4$, and then outputted via output terminal 95.

Figure 20:
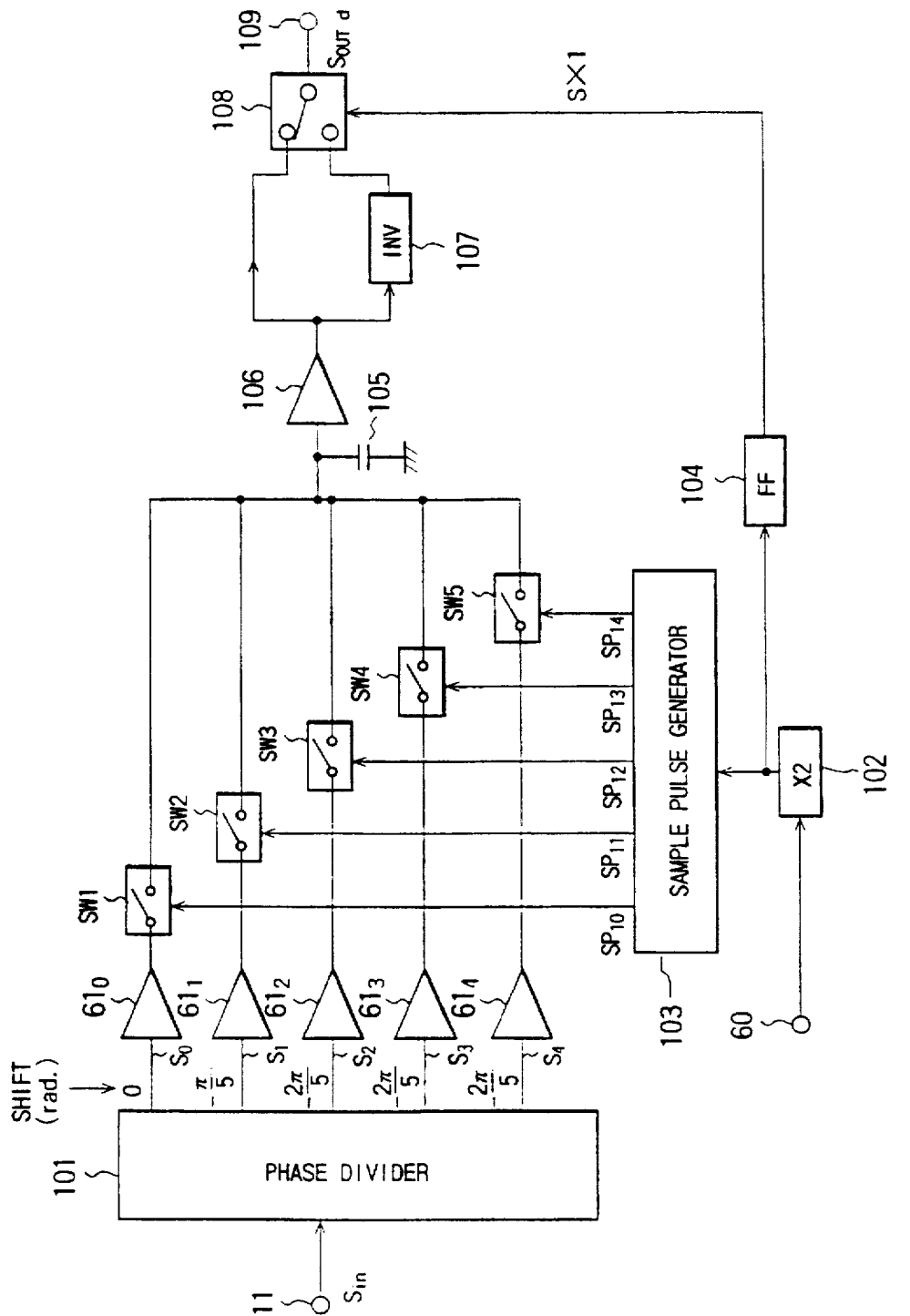
FIG. 20 is a block diagram showing a fourth preferred embodiment of the frequency convertor according to the present invention.

A fourth embodiment of the present invention will be described hereinbelow with reference to FIG. 20. In this fourth embodiment, a phase divider 101 divides the phase of a first input signal $S_{in}$ to generate five channel signals $S_{10}$ to $S_{14}$ whose phases are shifted π/5 by π/5 radian. The vectors of these channel signals $S_{10}$ to $S_{14}$ are represented by solid lines in FIG. 21.

On the other hand, a signal input signal having a local frequency $f_{local}$ inputted via input terminal 60 is multiplied by a ×2 frequency multiplier 102. The multiplied signal is supplied to a ring pulse generator circuit 103 to generate five sampling pulses $SP_{10}$ to $SP_{14}$ as shown in FIG. 15. These sampling pulses $SP_{10}$ to $SP_{14}$ are supplied to switching circuits SW1 to SW5, respectively. The switching circuits SW1 to SW5 are turned on to hold the channel signals $S_{10}$ to $S_{14}$ by the capacitor 105, only when the sampling pulses $SP_{10}$ to $SP_{14}$ are at the high level.

The voltage of the capacitor 105 is supplied to a switching circuit 108 via buffer amplifier 106. Further, the voltage of the capacitor 105 is inverted by an inverter 107 and then supplied to the switching circuit 108. On the other hand, the output signal of a ×2 frequency multiplier 102 is divided half by a flip-flop (FF) 104, and the obtained square waveform signal SX1 having a frequency $f_{local}$ as shown in FIG. 15 is applied to the switching circuit 108. Therefore, the switching circuit 108 outputs the output signal of the buffer amplifier 106 and the inversion signal of the inverter 107 alternately for each ½ $f_{local}$ in response to the square signal applied by the FF 104.

Figure 21:
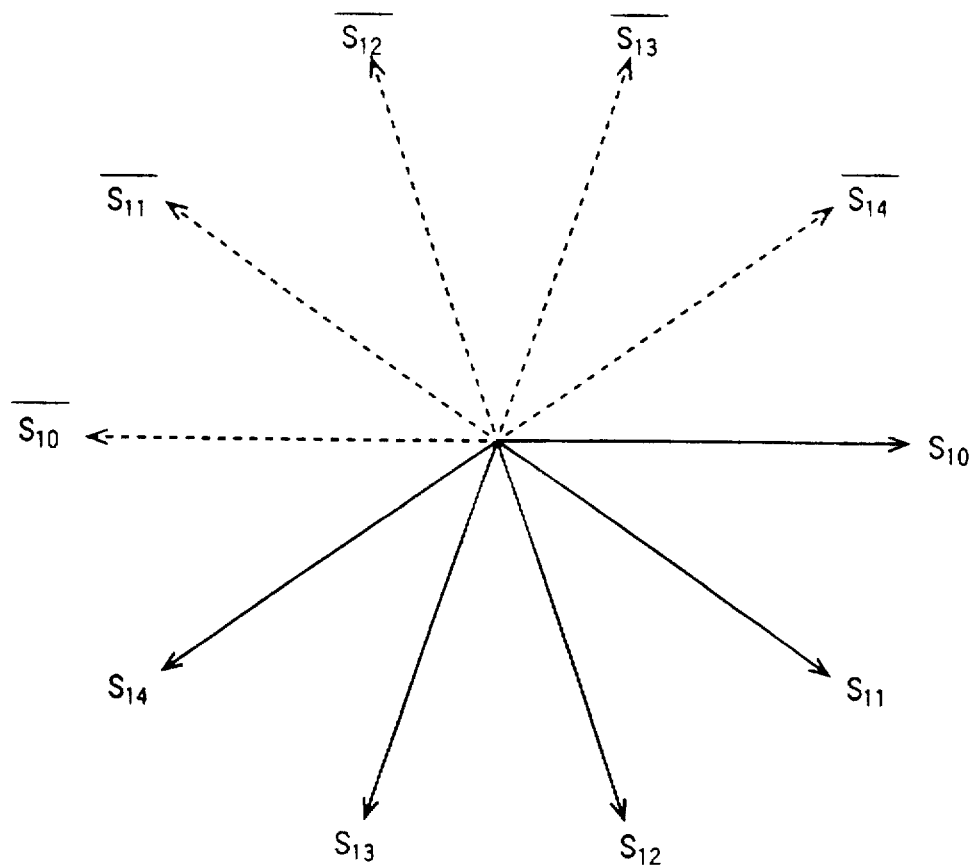
FIG. 21 is a vector diagram for assistance in explaining the operation of the circuit shown in FIG. 20.

Here, the vectors of the output signals of the buffer amplifier 106 are the same as those of the five channel signals $S_{10}$ to $S_{14}$ represented by the solid lines shown in FIG. 21. Further, the vectors of the output signals of the inverter 107 are represented by the dashed lines shown in FIG. 21. As a result, a signal can be outputted from the switching circuit 108 to an output terminal 109, as a frequency converted signal $S_{OUTd}$ (the same as obtained when 360 degrees are divided by ten) on the basis of the five channel signals.

Figure 22:
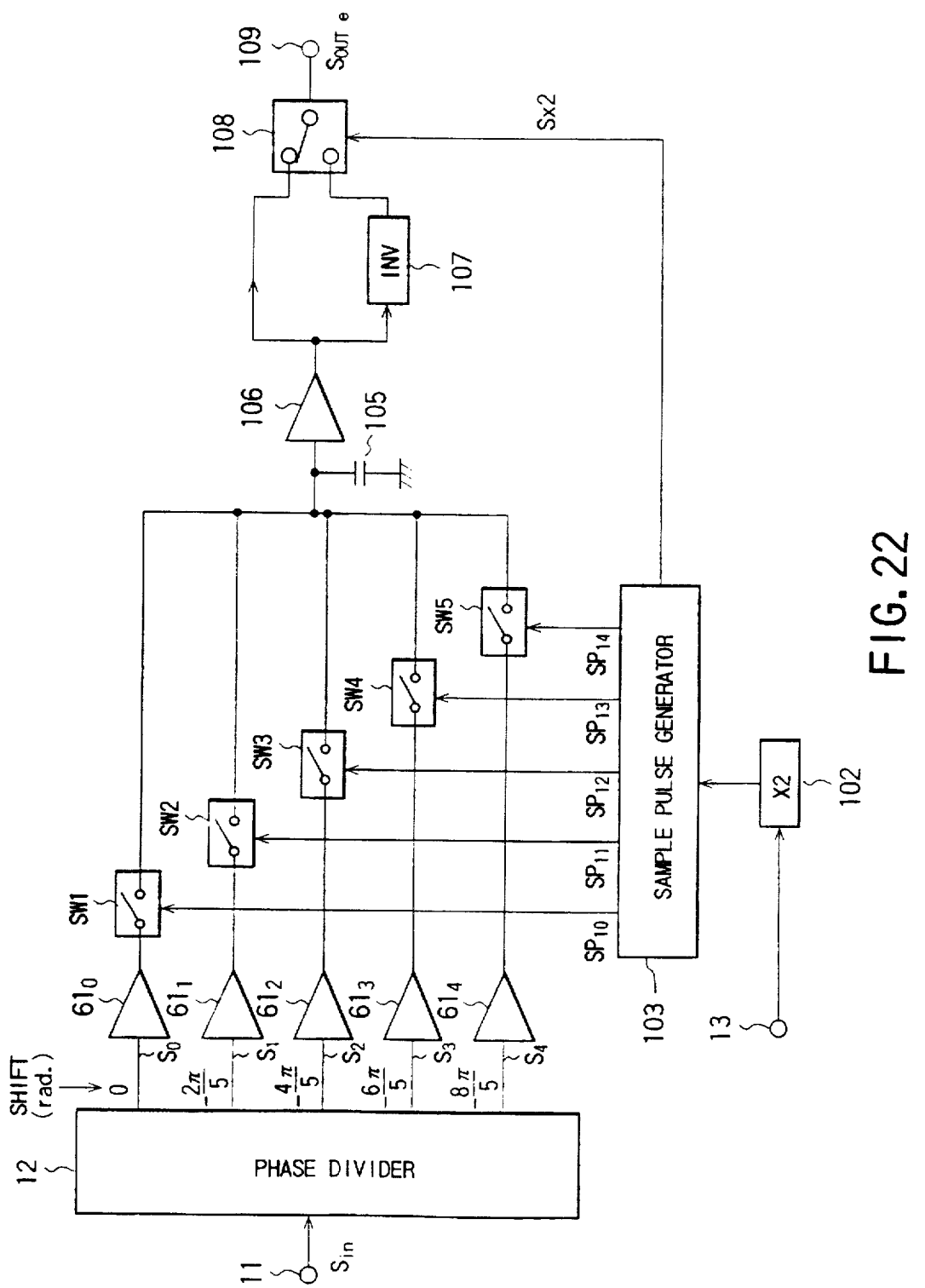
FIG. 22 is a block diagram showing a fifth preferred embodiment of the frequency converting circuit according to the present invention.

A fifth embodiment of the present invention will be described hereinbelow with reference to FIG. 22. In this figure, the same reference numerals are retained for similar elements having the same functions as with the case of the third or fourth embodiment shown in FIGS. 14 or 20, without repeating the similar description. In FIG. 22, the channel signals obtained by shifting the first input signal $S_{in}$ are the same as with the case of the third embodiment shown in FIG. 14. However, the switching sequence and the sampling speed is different between the two. Further, as the sampling pulses, the sampling pulses $SP_{10}$ to $SP_{14}$ the same as shown in FIG. 20 are used.

Figure 23:
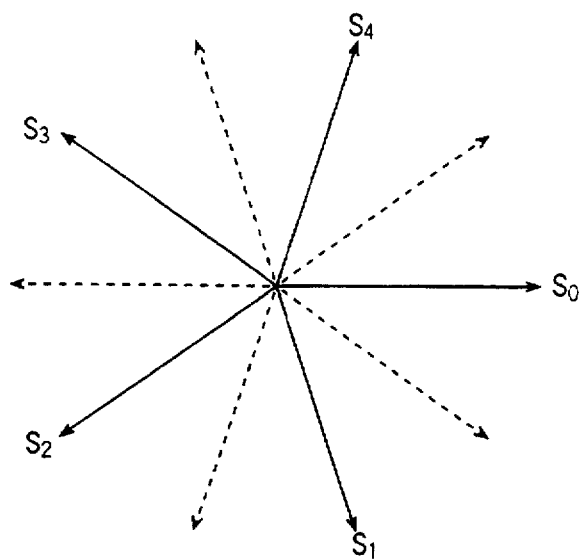
FIG. 23 is a vector diagram for assistance in explaining the operation of the circuit shown in FIG. 22.

Here, with reference to FIG. 15, when the signal $S_0$ is assumed to be sampled, the signal $S_3$ whose inverted phase is an intermediate value between the signals $S_0$ and $S_1$ is next sampled. After that, the signal $S_4$ whose inverted phase is an intermediate value between the signals $S_2$ and $S_1$ is next sampled. When the sampling is effected in sequence as described above and further when the sampled results are inverted for each sampling, as shown in FIG. 23, it is possible to obtain the same results as when the signals obtained by shifting the input signal 2π/10 by 2π/10 radian are sampled in sequence. Therefore, in this fifth embodiment, it is possible to obtain the same effect as with the case of the fourth embodiment shown in FIG. 20 such that ten phase division can be attained by use of the five phase-shifted channel signals.

In the above example, the five phase division has been explained. However, when taking into account the case where the number of divided phases is an odd number m, the phase signal whose phase becomes an intermediate value between $S_0$ and $S_1$ is the signal having a subscript of {(m−1)/2+1}. Therefore, when a series of the signals delayed 2π/m by 2π/m radian beginning from this signal having this subscript of {(m−1)/2+1} is denoted by B, and a series of the signals delayed 2π/m by 2π/m radian beginning from this signal of $S_0$ is denoted by A, both the A series and B series are to be sampled alternately in sequence in the order of the first signal of the A series, the first signal of the B series, the second signal of the A series, the second signal of the B series, . . . .

The above description is applied to the case where the frequency of ($f_{local}$−$S_{in}$) is required to obtain. Further, when the frequency of ($f_{local}$+$S_{in}$) is required to obtain, the channel signals are arranged in such a way that the phases can be advanced 2π/m by 2π/m radian in each series.

Figure 24:
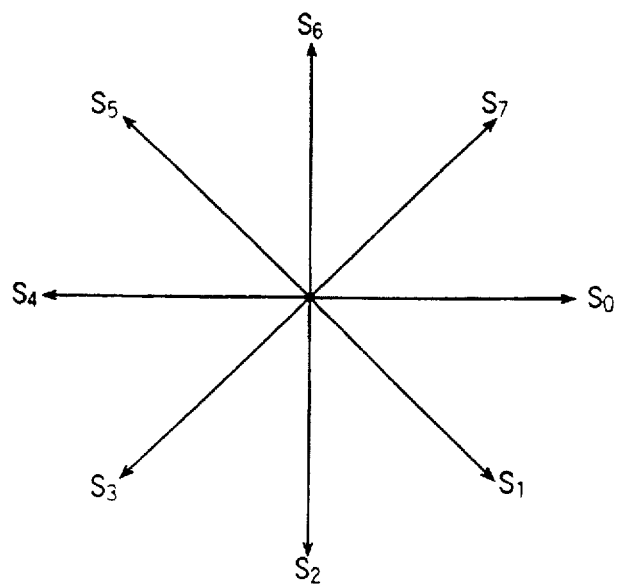
FIG. 24 is a similar vector diagram for assistance in explaining the operation of the circuit shown in FIG. 22.

Further, in the case where the number m of divided phases is an even number, since the m-units of the channel signals each having a phase obtained by dividing 2π into m in sequence include pairs of positive and negative phases, this case for the even number is different from the case for the odd number. Therefore, the switching method similar to the fifth embodiment shown in FIG. 22 and further applicable to an even number m of divided phases will be described hereinbelow by taking the case where the number of divided phases is eight with reference to FIG. 24.

Now, when the signal $S_0$ is assumed to be sampled, the signal $S_5$ which becomes $S_1$ when inverted next is sampled. After that, the signal $S_2$ is sampled, and then the signal $S_7$ which becomes $S_3$ when inverted next is sampled. When the sampling is effected as described above and further the inversion or non-inversion is switched alternately for each sampling, it is possible to obtain the sampling equivalent to the case when the eight phase signals are sampled in sequence.

In the general case where the number of divided phases is an even number m, if the frequency of ($f_{local}$−$S_{in}$) is required to obtain, a channel signal series A in which the phases are delayed 2(2π/m) by 2(2π/m) radian beginning from $S_0$ and a channel signal series B in which the phases are delayed 2(2π/m) by 2(2π/m) radian beginning from the channel signal S having a subscript of {(m/2)+1} are to be sampled alternately in sequence. Further, in order to obtain the frequency of ($f_{local}$+$S_{in}$), the channel signals are arranged in such a way that the phases are advanced (2π/m)×2 by (2π/m)×2 radian in each series.

Further, in the case where the number of divided phases is an even number m, it is also possible to obtain the same effect as when m-phase channel signals are switched in the order of advanced or delayed phases. In this case, m/2 units of one of a pair of two phases are selected from the m phase signals. The two phases have opposite phase relationship with respect to each other. When the other of the pair is selected, the channel signal having a phase opposite to the one of the phase pair is sampled and its phase is inverted. This method can be adopted as a modification of all the above-mentioned first to fifth embodiments.

A sixth embodiment of the present invention will be described hereinbelow with reference to FIGS. 25 and 26.

Figure 25:
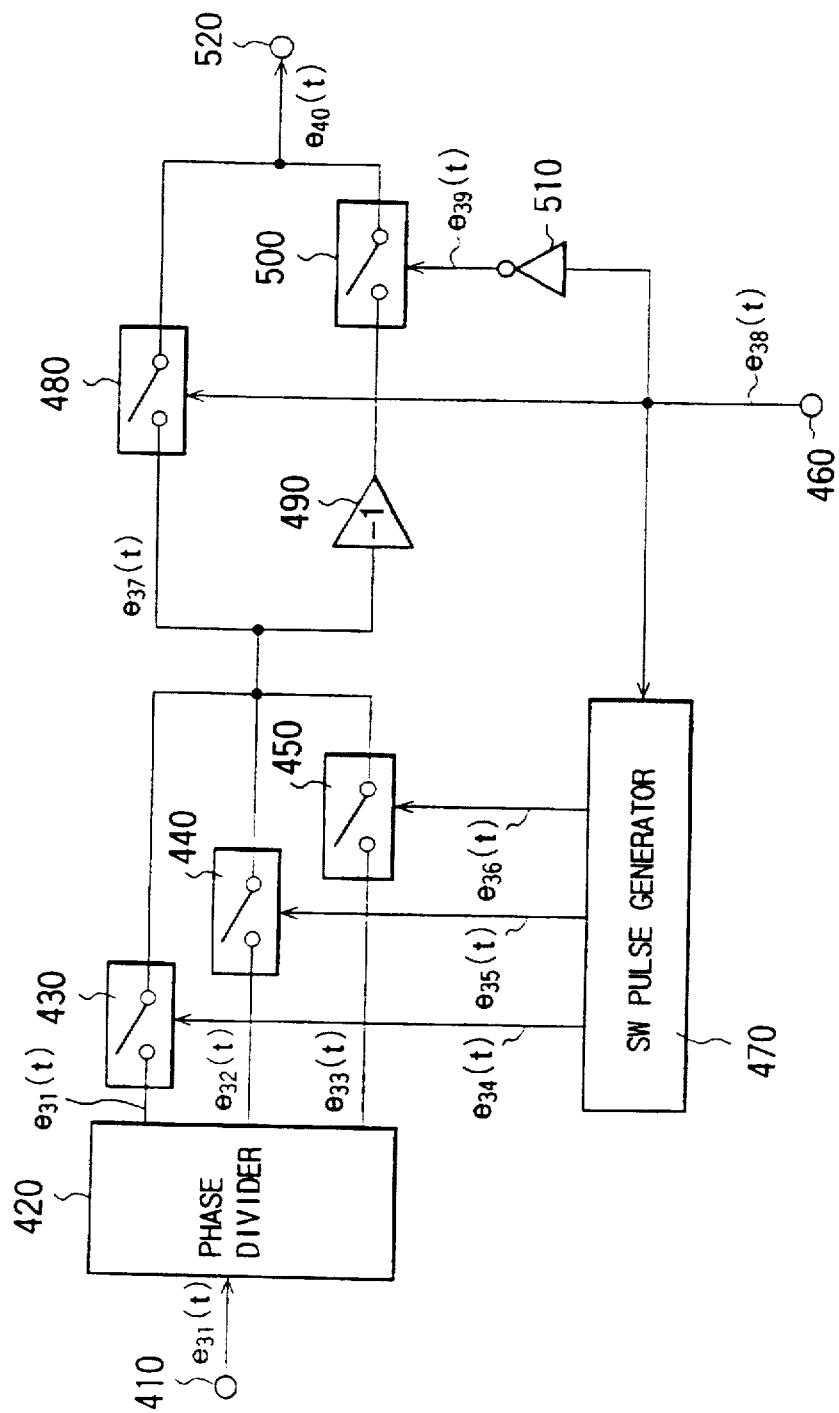
FIG. 25 is a block diagram showing a sixth preferred embodiment of the frequency converting circuit according to the present invention.
Figure 26:
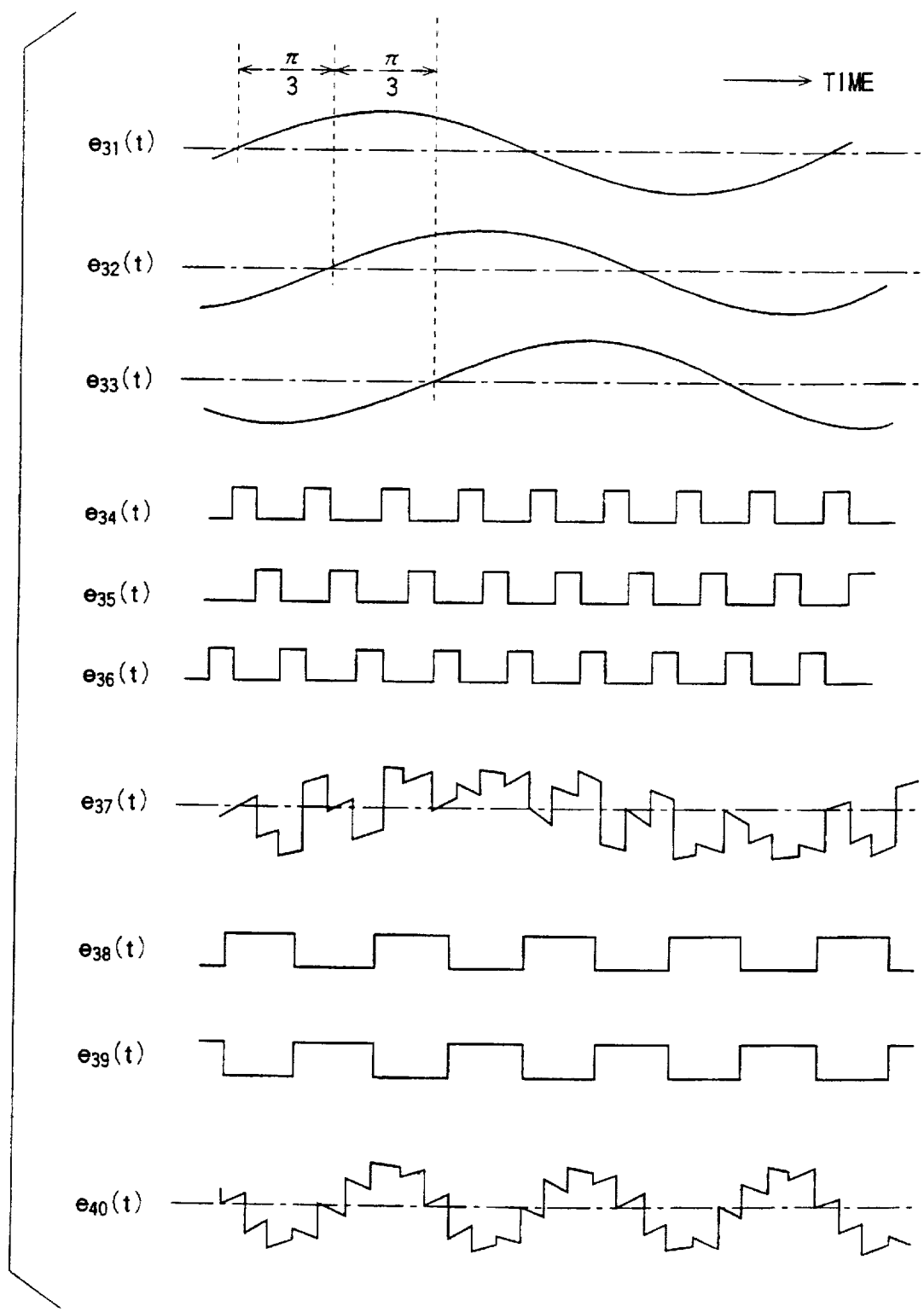
FIG. 26 is a timing chart for assistance in explaining the operation of the circuit shown in FIG. 25.

In FIG. 25, a first input signal $e_{31}(t)$ as shown in FIG. 26 is supplied via input terminal 410 to a phase divider 420. Here, the first input signal $e_{31}(t)$ is divided into three signals $e_{31}(t)$, $e_{32}(t)$ and $e_{33}(t)$ having three phases different from each other by dividing a phase range of π radian into three equivalent angular intervals. As understood by FIG. 26, the signal $e_{31}(t)$ is $A_1 \sin \omega_1 t$; the signal $e_{32}(t)$ is $A_1 \sin (\omega_1 t - \pi/3)$; and the signal $e_{33}(t)$ is $A_1 \sin (\omega_1 t - 2\pi/3)$.

On the other hand, a second input signal $e_{38}(t)$ of square waveform as shown in FIG. 26 is supplied via input terminal 460 to a switching signal generator 470, a switching circuit 480, and an inverter 510. The switching signal generator 470 generates three signals $e_{34}(t)$, $e_{35}t)$ and $e_{36}(t)$ having different phases from one another in parallel in synchronism with the second input signal $e_{38}(t)$. Here, if the amplitude of the second input signal $e_{38}(t)$ is "0" in a range $-\pi < \omega_2 t < 0$, and "$A_2$" in a range $0 < \omega_2 t < \pi$, the second input signal $e_{38}(t)$ can be expressed as $$e_{38}(t) = (A_2/2) + (A_2/\pi) \sum_{n=1}^{\infty} \sin(2n-1)w_2 t/(2n-1)$$

where n denotes a natural number.

The switching circuits 430, 440 and 450 operate in such a way as to pass the signals $e_{31}(t)$, $e_{32}(t)$ and $e_{33}(t)$ only when the corresponding switching signals $e_{34}(t)$, $e_{35}(t)$ and $e_{36}(t)$ are at the high level, respectively. On the contrary, the switching circuits 430, 440 and 450 do not to pass the signals $e_{31}(t)$, $e_{32}(t)$ and $e_{33}(t)$ when the switching signals $e_{34}(t)$, $e_{35}(t)$ and $e_{36}(t)$ are at the low level, respectively. Further, the selected output signals of the switching circuits 430, 440 and 450 are synthesized as a signal $e_{37}(t)$ as shown in FIG. 26.

This synthesized signal $e_{37}(t)$ is supplied to a switching circuit 480 and another switching circuit 500 after having been inverted through an inversion amplifier 490. To the switching circuit 480, the second input signal $e_{38}(t)$ is inputted via input terminal 460 as a switching signal. Further, to the switching circuit 500, a signal $e_{39}(t)$ obtained by inverting the second input signal $e_{38}(t)$ by an inverter 510 and as shown in FIG. 26 is inputted as a switching signal. These switching circuits 480 and 500 operate in such a way as to pass the signals supplied thereto only when the corresponding switching signals $e_{38}(t)$ and $e_{39}(t)$ are at the high level, respectively.

The two output signals of the switching circuits 480 and 500 are added as a synthesized signal $e_{40}(t)$ as shown in FIG. 26, and then outputted via output terminal 520. This output signal $e_{40}(t)$ is a frequency converted signal having a fundamental frequency of a differential angular frequency ($\omega_1 - \omega_2$) between the first and second input signals $e_{31}(t)$ and $e_{38}(t)$ as follows:

$$e_{40}(t) = -(A_1 A_2/\pi)[\sin\{\omega_2 t - \omega_1 t - (\pi/6)\} + (1/5)\sin\{5\omega_2 t + \omega_1 t + (5\pi/6)\} - (1/7)\sin\{7\omega_2 t - \omega_1 t - (\pi/6)\} + \ldots]$$

Figure 27:
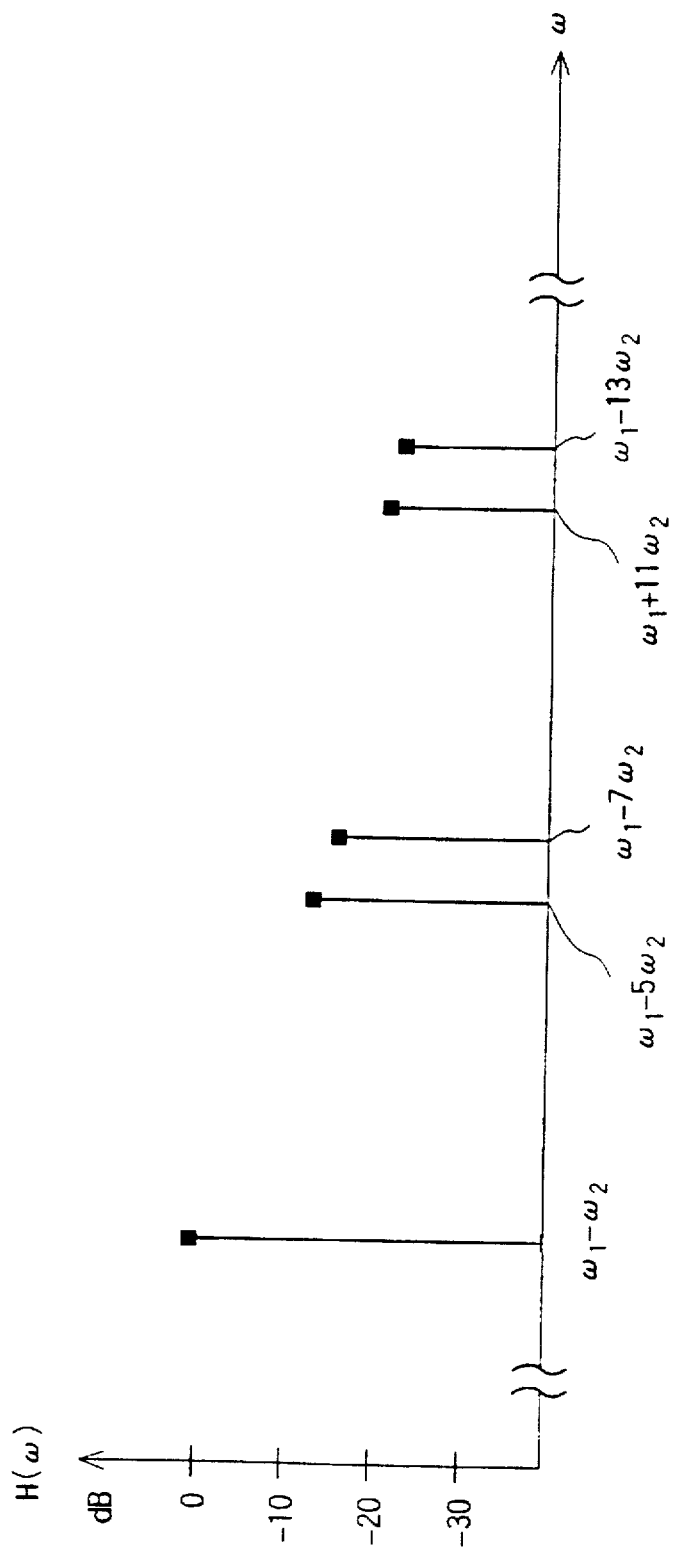
FIG. 27 is a diagram showing the frequency spectrum of the output signal of the circuit shown in FIG. 25.

Further, in the frequency spectrum of the output signal $e_{40}(t)$, the three-order higher harmonic components and nine-order higher harmonic components can be eliminated, as shown in FIG. 27. Therefore, in this sixth embodiment, it is possible to easily detect the fundamental frequency of the output signal by use of a filter having gently sloped frequency characteristics, as compared with the conventional frequency converting circuit.

Figure 28A:
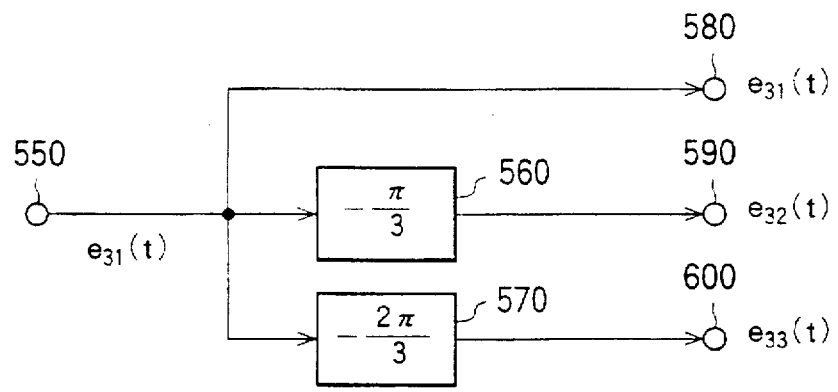
FIGS. 28A, 28B and 28C are block diagrams each showing an example of the phase dividing circuit shown in FIG. 25.
Figure 28B:
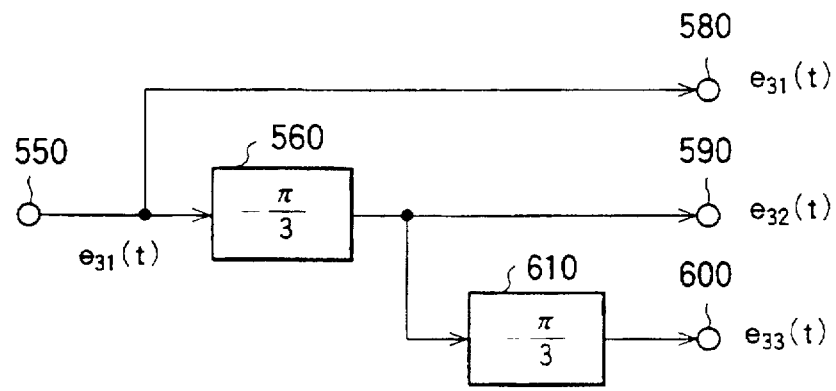
Figure 28C:
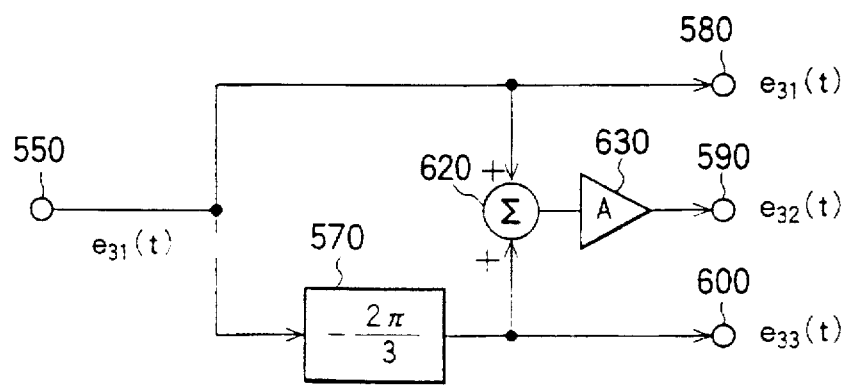

The phase divider 420 as shown in FIG. 25 can be constructed by any one of the circuits as shown in FIGS. 28A, 28B and 28C.

In the circuit as shown in FIG. 28A, the first input signal $e_{31}(t)$ inputted via input terminal 550 is directly outputted via output terminal 580; supplied to a $-\pi/3$ phase shifter 560 to output an output signal $e_{32}(t)$ via output terminal 590; and supplied to a $-2\pi/3$ phase shifter 570 to output an output signal $e_{33}(t)$ via output terminal 600.

In the circuit as shown in FIG. 28B, the first input signal $e_{31}(t)$ inputted via input terminal 550 is directly outputted via output terminal 580; supplied to a $-\pi/3$ phase shifter 560 to output an output signal $e_{32}(t)$ via output terminal 590; and supplied to both the $-\pi/3$ phase shifter 560 and another $-\pi/3$ phase shifter 610 to output an output signal $e_{33}(t)$ via output terminal 600.

In the circuit as shown in FIG. 28C, the first input signal $e_{31}(t)$ inputted via input terminal 550 is directly outputted to an output terminal 580; and supplied to a $-2\pi/3$ phase shifter 570 to output an output signal $e_{33}(t)$ via output terminal 600, in the same way as with the case shown in FIG. 28A. In this circuit, however, the output signal $e_{32}(t)$ is formed in a way different from that of the circuit shown in FIG. 28A. In more detail, the input signal $e_{31}(t)$ and the output signal $e_{33}(t)$ of the $-2\pi/3$ phase shifter 570 are both added to each other by an adder 620. Further, the added signal is shifted by $-\pi/3$ radian by an amplifier 630 having an appropriate gain to output an output signal $e_{32}(t)$ via output terminal 590.

Figure 29:
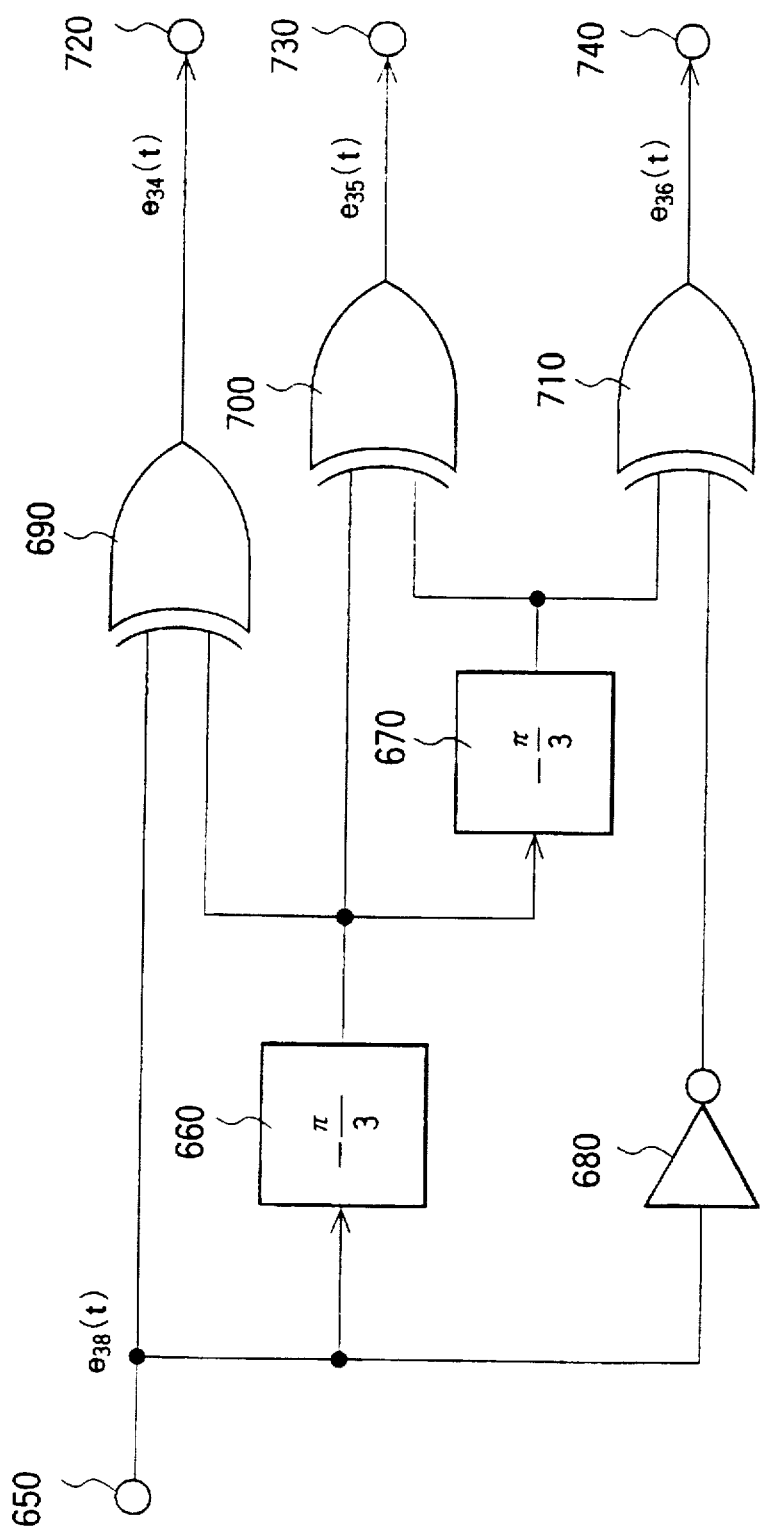
FIG. 29 is a circuit diagram showing an example of the switching signal generator shown in FIG. 25.

Further, the switching signal generator 470 shown in FIG. 25 can be constructed by a circuit as shown in FIG. 29. In FIG. 29, a second input signal $e_{38}(t)$ inputted via input terminal 650 (corresponding to the input terminal 460 shown in FIG. 25) is supplied to one of two input terminals of an exclusive OR gate 690 and to the other input terminal through a $-\pi/3$ phase shifter 660. A signal $e_{34}(t)$ of the exclusive OR gate 690 is then outputted via output terminal 720.

Further, the output signal of the $-\pi/3$ phase shifter 660 is inputted to one of two input terminals of an exclusive OR gate 700 and to the other input terminal through a $-\pi/3$ phase shifter 670. A signal $e_{35}(t)$ of the exclusive OR gate 700 is then outputted via output terminal 730.

Further, the second input signal $e_{38}(t)$ is shifted by an inverter 680 by $-\pi$ radian and further shifted by $-2\pi/3$ radian in total by the two $-\pi/3$ phase shifters 660 and 670. The two shifted signal are inputted to two input terminals of an exclusive OR gate 710 to output a signal $e_{36}(t)$ via output terminal 740.

In the sixth embodiment as shown in FIG. 25, the frequency shifting circuit is of three phase-divided system, so that the input signals $e_{31}(t)$, $e_{32}(t)$ and $e_{33}(t)$ of three different phases are outputted from the phase divider 420. Therefore, the phase difference between the two adjacent signals is $-\pi/3$ radian, as shown in FIG. 26. Without being limited only thereto, the sixth embodiment of the frequency converting circuit according to the present invention can be applied to an odd-number phase-divided system such as a five phase-divided system for generating the phase difference of $-\pi/5$ radian between the two adjacent signals or a seven phase-divided system for generating the phase difference of $-\pi/7$ radian between the two adjacent signals. In this case, although the waveform roughness of the outputted frequency converted signal can be reduced with increasing number of the divided phases, the basic operation of the frequency converting circuit is the same as with the circuit shown in FIG. 25, irrespective of the number of divided phases.

Further, in the circuit shown in FIG. 25, the fundamental frequency of the signal outputted via output terminal 520 corresponds to a difference between the first and second input signals. However, when the phase of the first or the second input signal is reversed, it is apparent that an output signal having an added fundamental frequency can be obtained.

As described above, the sixth embodiment as shown in FIG. 25 employs the switching circuits 430 to 450 and 480 and 500 instead of the DBMs (double balanced mixers). It is thus possible to prevent the circuit characteristics from deteriorating due to unbalanced conditions (which tends to occur in the DBMs). Further, the adder circuits are replaced with the switching circuits. It is thus possible to prevent the circuit characteristics from deteriorating due to the mixing error caused by the signal levels of the adders.

Further, in the sixth embodiment shown in FIG. 25, the number of the divided phases is determined as "3" (the minimum unit). Without being limited only thereto, the number of the divided phases can be determined to be another odd number such as "7" or "9" or another number $2^n$ (n: a natural number) times larger than the minimum unit. In other words, in the same way as with the other embodiments as shown, it is possible to use all the numbers (excluding an integer expressed by $2^2$) as the number of divided phases.

As described above, in the frequency converting circuit according to the present invention, the number of divided phases can be determined freely, it is thus possible to increase the degree of design freedom, as compared with the conventional frequency converting circuit. In particular, when the number of the divided phases is "3", it is possible to achieve a frequency converting circuit suitable for an integrated circuit free from the influence of unbalanced conditions of the double balanced mixers, in spite of a simplified circuit construction.

Further, in the frequency converting circuit according to the present invention, the output signal is of square waveform having no sharply changed portions. The high frequency components of the output signal waveform thus can be reduced. Further, it is possible to use a low-costly filter having gently frequency characteristics, when the signal having any desired added or subtracted frequency obtained on the basis of the input signal is filtered. In addition, it is possible to prevent noise from being mixed with the other circuits (e.g., analog circuits) through a voltage supply or the ground.

Further, in the frequency converting circuit according to the present invention, it is possible to obtain an output signal equivalent to the frequency converted signal obtained by the number of divided phases two times larger than the number m of the channel signals divided by the phase dividing circuit. The output signal having less high frequency components thus can be obtained, in spite of the simplified circuit construction. Further, the frequency converting circuit according to the present invention can be applied to various fields such as integrated circuits provided with no balancing adjustment, single side band modulating circuits, signal spectrum changing circuits (e.g., for secret speech system), etc.

Further, in the frequency converting circuit according to the present invention, the circuit is constructed by use of the switching circuits instead of the double balanced mixers. It is thus possible to prevent the characteristics from deteriorating due to unbalanced conditions of the double balanced mixers. Further, the roughness of the output signal waveform similar to that of the conventional circuit using the switching circuits can be obtained by a construction of the less number of divided phases. The circuit construction thus can be simplified markedly, and further the roughness of the frequency converted output signal can be improved markedly.

What is claimed is:

1. A frequency converting circuit, comprising:

phase dividing means for dividing a phase of a first input signal having a first frequency and outputting m-units of channel signals each having the first frequency but different phases shifted $2\pi/m$ by $2\pi/m$ radian respectively, where m is three or a natural number greater than 3 except $2^n$, where n is a natural number;

switching means for switching the m-units of the channel signals and outputting switched channel signals; and switching pulse generating means responsive to a second input signal having a second frequency higher than that of the first input signal, for generating a plurality of switching pulse signals and further for switching and outputting the m-units of channel signals having different phases shifted $2\pi/m$ by $2\pi/m$ radian for each constant period, by controlling the switching means on the basis of the generated switching pulse signals, wherein the switched channel signals are synthesized to output a signal having a third frequency equal to either a frequency difference between the first and the second frequencies or a frequency addition of the first and the second frequencies.

2. The frequency converting circuit of claim 1, wherein the phase dividing means comprises:

phase shifting means for outputting the first input signal as it is as a first channel signal of the m-units of the channel signals, and a third signal having a phase different from the first input signal by 90 degrees;

an inverter for inverting a phase of the first channel signal to output a first phase inversion signal;

first level adjusting means for adjusting a level of the third signal at a first predetermined level; and output means for outputting (m−1)-units of channel signals other than the first channel signal, on the basis of the first phase inversion signal and the third signal adjusted at the first predetermined level, the first channel signal and the (m−1)-units of channel signals being supplied to the switching means.

3. The frequency converting circuit of claim 2, wherein, when the natural number m is three and further the phase dividing means outputs the first channel signal, a second channel signal and a third channel signal having different phases shifted $2\pi/3$ by $2\pi/3$ radian, respectively, the outputting means further comprises:

a second level adjuster for adjusting a level of the first phase inversion signal at a second predetermined level;

a first adder for adding the third signal adjusted at the first predetermined level and the first phase inversion signal adjusted at the second predetermined level, to output the second channel signal;

a second inverter for inverting a phase of the third signal adjusted at the first predetermined level, to output a second phase inversion signal; and a second adder for adding the first phase inversion signal adjusted at the second predetermined level and the second phase inversion signal, to output the third channel signal.

4. The frequency converting circuit of claim 2, wherein, when the natural number m is five and further the phase dividing means outputs the first channel signal, and second, third, fourth and fifth channel signals having different phases shifted $2\pi/5$ by $2\pi/5$ radian from the first channel signal, respectively, the outputting means further comprises:

a first adder for adding the first phase inversion signal and the third signal adjusted at the first predetermined level, to obtain a first addition signal;

a second inverter for inverting a phase of the third signal adjusted at the first predetermined level, to output a second phase inversion signal;

a second adder for adding the first and second phase inversion signals with each other, to output a second addition signal;

a second level adjuster for adjusting levels of the first and second addition signals at second and third predetermined levels, to output the third and fifth channel signals, respectively; and a third adder for adding the first and third channel signals with each other, to obtain the second channel signal, and further for adding the first and fifth channel signals with each other, to obtain the fourth channel signal.

5. The frequency converting circuit of claim 1, wherein the switching pulse generating means comprises:

a counter responsive to the second input signal, for counting the natural number m, and for outputting a carry signal having a frequency m-times higher than that of the channel signals; and a flip-flop circuit having m-stage series connected flip-flops, for generating the switching pulse signals each having a frequency m-times higher than that of the channel signals and shifted for each constant period, on the basis of the second input signal inputted to clock inputs of the respective flip-flops and the carry signal inputted to the first-stage flip-flop.

6. The frequency converting circuit of claim 1, wherein the switching pulse generating means comprises:

a frequency generator responsive to the second input signal, for outputting a first pulse signal having a frequency m-times higher than that of the second input signal;

a counter for counting the first pulse signal and for outputting a carry signal having a frequency m-times higher than that of the channel signals;

a flip-flop circuit having a m-stage series connected flip-flops, for generating m-units of second pulse signals each having a frequency m-times higher than that of the channel signals and shifted for each constant period, on the basis of the pulse signal inputted to clock inputs of the respective flip-flops and the carry signal inputted to the first-stage flip-flop; and a pulse generator responsive the m-units of the second pulse signals, for generating a plurality of the switching pulse signals each having a pulse width narrower than that of the second pulse signal.

7. The frequency converting circuit of claim 6, wherein the switching pulse generator comprises:

a delay circuit for outputting delay signals obtained by delaying each of the m-units of the second pulse signals by a delay time equal to the pulse width;

an inverter for inverting the delayed signals; and an AND circuit for obtaining an AND of each of the m-units of the second pulse signals and each of the delayed inversion signals, to output a plurality of switching pulse signals having a pulse width narrower than that of the second pulse signal.

8. The frequency converting circuit of claim 1, wherein, when m is three, the switching pulse generator comprises:

first delay means for delaying the second input signal by $-\pi/3$ radian to output a first delay signal;

a first EX-OR circuit for EX-ORing the second input signal and the first delay signal to output a first switching pulse signal;

second delay means for delaying the first delay signal by $-\pi/3$ radian to output a second delay signal;

a second EX-OR circuit for EX-ORing the first and second delay signals to output a second switching pulse signal delayed by a predetermined period with respect to the first switching pulse signal;

an inverter for inverting the second input signal; and a third EX-OR circuit for EX-ORing the second delay signal and the inverted second signal to output a third switching pulse signal delayed by the predetermined period with respect to the second switching pulse signal.

9. The frequency converting circuit of claim 1, wherein the switching pulse generating means sequentially generates the m-units of sampling pulses with an interval corresponding to $2\pi/m$ radian of a phase of the second input signal, further comprising holding means for sequentially holding the m-units of the channel signals sampled by the m-units of the sampling pulses.

10. The frequency converting circuit of claim 5, further comprising:

holding means for holding an average value of output signals of the switching means during 1/m of one period of the switching pulse signals temporarily at a first timing; and additional switching means controlled on the basis of the switching pulse signals, for switching and outputting the temporarily held signals at a second timing following the first timing, wherein output signals of the additional switching means are synthesized to output a signal having either a frequency difference between the first and the second frequencies or a frequency addition of the first and the second frequencies.

11. The frequency converting circuit of claim 1, further comprising:

a frequency multiplier for doubling a frequency of the second input signal and outputting the doubled second input signal to the switching pulse generating means;

holding means for holding output signal of the switching means temporarily;

an inverter for inverting the temporarily held signal and outputting the inversion signal; and additional switching means for outputting the temporarily held signal and the inversion signal alternately, on the basis of a signal obtained by dividing the multiplied second input signal into a half thereof.

12. The frequency converting circuit of claim 1, wherein the switching pulse generating means further comprises a frequency divider for dividing the frequency of the first input pulse into a half thereof, and wherein the frequency converting circuit further comprises:

holding means for holding output signal of the switching means temporarily;

an inverter for inverting the temporarily held signal and outputting the inversion signal; and additional switching means for outputting the temporarily held signal and the inversion signal alternately, on the basis of a signal obtained by dividing the first input signal into a half thereof.

13. The frequency conversion circuit of claim 1, further comprising:

first gating means for passing an output signal of the switching means on the basis of the second input signal;

an inverter for inverting the output signal of the switching means and outputting the inversion signal; and second gating means for passing the inversion signal on the basis of an inversion signal of the second input signal, wherein output signals of the first and second gating means are synthesized to output a signal having a frequency difference between the first input signal and the plurality of the switching pulse signals or a frequency addition of the first input signal and the plurality of the switching pulse signals.

* * * * *